(12) United States Patent
Park et al.

(10) Patent No.: US 11,177,335 B2
(45) Date of Patent: Nov. 16, 2021

(54) DISPLAY DEVICE

(71) Applicant: SAMSUNG DISPLAY CO., LTD., Yongin-si (KR)

(72) Inventors: Juchan Park, Yongin-si (KR); Sunho Kim, Yongin-si (KR); Younggug Seol, Yongin-si (KR); Sunhee Lee, Yongin-si (KR); Joosun Yoon, Yongin-si (KR); Jonghyuk Lee, Yongin-si (KR); Jonghyun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 425 days.

(21) Appl. No.: 16/155,391

(22) Filed: Oct. 9, 2018

(65) Prior Publication Data

US 2019/0148476 A1    May 16, 2019

(30) Foreign Application Priority Data

Nov. 15, 2017    (KR) .......................... 10-2017-0152503

(51) Int. Cl.
   *H01L 27/32*    (2006.01)
   *H01L 27/12*    (2006.01)
   (Continued)

(52) U.S. Cl.
   CPC ....... *H01L 27/3276* (2013.01); *G09G 3/3258* (2013.01); *G09G 3/3266* (2013.01);
   (Continued)

(58) Field of Classification Search
   CPC .. H01L 51/5256; H01L 27/124; G09G 3/3266
   See application file for complete search history.

(56) References Cited

U.S. PATENT DOCUMENTS

2003/0016308 A1* 1/2003 Jeon ..................... G02F 1/13454
                                                              349/39
2014/0217397 A1* 8/2014 Kwak ................. H01L 27/1218
                                                              257/43

(Continued)

FOREIGN PATENT DOCUMENTS

KR    10-2016-0038552    4/2016
KR    10-2016-0047132    5/2016
(Continued)

OTHER PUBLICATIONS

Extended Search Report dated Mar. 22, 2019 in corresponding European Patent Application No. 18206260.4.

*Primary Examiner* — Kenneth Parker
*Assistant Examiner* — Long H Le
(74) *Attorney, Agent, or Firm* — F. Chau & Associates, LLC

(57) ABSTRACT

A display device includes a substrate including a display area and a peripheral area disposed outside of the display area. The display area includes a plurality of pixels. The display device further includes an inorganic insulating layer disposed in the display area. The inorganic insulating layer includes a groove disposed in a region between the plurality of pixels. The display device further includes an organic material layer filling the groove, a first connection wiring, and a second connection wiring. The first connection wiring is disposed on the organic material layer, overlaps the plurality of pixels, and extends in a second direction. The second connection wiring is insulated from the first connection wiring, and extends in a first direction that crosses the second direction.

19 Claims, 20 Drawing Sheets

(51) Int. Cl.
*H01L 51/52* (2006.01)
*H01L 51/00* (2006.01)
*G09G 3/3291* (2016.01)
*G09G 3/3266* (2016.01)
*G09G 3/3258* (2016.01)

(52) U.S. Cl.
CPC ......... *G09G 3/3291* (2013.01); *H01L 27/124* (2013.01); *H01L 51/0097* (2013.01); *H01L 51/5256* (2013.01); *G09G 2300/0426* (2013.01); *H01L 2251/5338* (2013.01)

(56) References Cited

U.S. PATENT DOCUMENTS

| | | |
|---|---|---|
| 2014/0264425 A1 | 9/2014 | Chida |
| 2015/0250038 A1 | 9/2015 | Sakuishi et al. |
| 2016/0118451 A1* | 4/2016 | Youn .................. H01L 27/3262 257/40 |
| 2016/0204177 A1* | 7/2016 | Kim .................... H01L 27/1222 257/40 |
| 2017/0288168 A1 | 10/2017 | Kim et al. |

FOREIGN PATENT DOCUMENTS

| | | |
|---|---|---|
| KR | 10-2016-0054867 | 5/2016 |
| KR | 10-2017-0039537 | 4/2017 |

\* cited by examiner

DISPLAY DEVICE

CROSS-REFERENCE TO RELATED APPLICATIONS

This application claims priority under 35 U.S.C. § 119 to Korean Patent Application No. 10-2017-0152503, filed on Nov. 15, 2017, the disclosure of which is incorporated by reference herein in its entirety.

TECHNICAL FIELD

Exemplary embodiments of the inventive relate to a display device.

DISCUSSION OF THE RELATED ART

Generally, a display device includes a display element and electronic elements that control an electric signal applied to the display element. The electronic elements include, for example, thin film transistors (TFTs), storage capacitors, and wirings.

Increasing the number of TFTs electrically connected to one display element and the number of wirings that transfer an electric signal to the TFTs may result in the ability to more accurately control the emission and an emission degree of a display element.

SUMMARY

Exemplary embodiments of the inventive concept include a flexible display device having increased strength to protect against an external impact.

According to an exemplary embodiment of the inventive concept, a display device includes a substrate including a display area and a peripheral area disposed outside of the display area. The display area includes a plurality of pixels. The display device further includes an inorganic insulating layer disposed in the display area. The inorganic insulating layer includes a groove disposed in a region between the plurality of pixels. The display device further includes an organic material layer filling the groove, a first connection wiring, and a second connection wiring. The first connection wiring is disposed on the organic material layer, overlaps the plurality of pixels, and extends in a second direction. The second connection wiring is insulated from the first connection wiring, and extends in a first direction that crosses the second direction.

In an exemplary embodiment, the organic material layer surrounds at least some of the plurality of pixels.

In an exemplary embodiment, the organic material layer surrounds each of the plurality of pixels.

In an exemplary embodiment, the plurality of pixels includes a first pixel and a second pixel disposed adjacent to each other in the second direction, a scan line of the first pixel is spaced apart from a scan line of the second pixel by the organic material layer, and the scan line of the first pixel is connected to the scan line of the second pixel by the first connection wiring.

In an exemplary embodiment, an elongation rate of the first connection wiring is greater than an elongation rate of the scan line of the first pixel, and the elongation rate of the first connection wiring is greater than an elongation rate of the scan line of the second pixel.

In an exemplary embodiment, the organic material layer extends to an upper surface of the inorganic insulating layer.

In an exemplary embodiment, the display device further includes an interlayer insulating layer covering the first connection wiring. The interlayer insulating layer includes an opening exposing the organic material layer, and an upper-organic material layer filling the opening.

In an exemplary embodiment, at least a portion of an upper surface of the organic material layer includes an uneven surface.

In an exemplary embodiment, each of the plurality of pixels includes a driving thin film transistor and a storage capacitor, and the driving thin film transistor overlaps the storage capacitor.

In an exemplary embodiment, the display device further includes a bendable organic material layer disposed in a bent area in the peripheral area. The bent area is bent around a bending axis extending in the second direction. The display device further includes a pan-out wiring passing over the bendable organic material layer in the first direction.

In an exemplary embodiment, the bendable organic material layer is simultaneously formed with the organic material layer using a same material as the organic material layer, and the pan-out wiring is simultaneously formed with the first connection wiring or the second connection wiring using a same material as the first connection wiring or the second connection wiring.

According to an exemplary embodiment of the inventive concept, a display device includes a substrate including a display area, a first pixel, a second pixel disposed adjacent to the first pixel in the display area in a second direction, at least one first connection wiring connecting the first pixel to the second pixel, a first scan line included in the first pixel and extending in the second direction, a second scan line included in the second pixel and extending in the second direction, and a gate insulating layer covering the first scan line and the second scan line. The gate insulating layer includes a groove disposed in a region between the first pixel and the second pixel. The display device further includes an organic material layer filling the groove, and a scan connection line disposed over the gate insulating layer and the organic material layer. The scan connection line connects the first scan line to the second scan line through a contact hole, and the scan connection line is included in the at least one first connection wiring.

In an exemplary embodiment, the display device further includes a third pixel disposed in the display area. The third pixel is adjacent to the first pixel in a first direction crossing the second direction. The display device further includes at least one second connection wiring connecting the first pixel to the third pixel. A first semiconductor layer included in the first pixel is spaced apart from a third semiconductor layer included in the third pixel by the organic material layer, and an intermediate connection line included in the at least one second connection wiring crosses over the organic material layer and connects the first semiconductor layer to the third semiconductor layer through a contact hole.

In an exemplary embodiment, at least one first connection wiring is insulated from the at least one second connection wiring by an interlayer insulating layer.

In an exemplary embodiment, the at least one second connection wiring further includes a driving voltage line and a data line.

In an exemplary embodiment, each of the first pixel and the second pixel includes a driving thin film transistor and a storage capacitor. The driving thin film transistor overlaps the storage capacitor, and an upper electrode of the storage capacitor of the first pixel is connected to an upper electrode of the storage capacitor of the second pixel by a mesh connection line included in the at least one first connection wiring.

In an exemplary embodiment, the display device further includes an interlayer insulating layer covering the at least one first connection wiring. The interlayer insulating layer includes an opening exposing the organic material layer. The display device further includes an upper-organic material layer filling the opening of the interlayer insulating layer.

In an exemplary embodiment, an elongation rate of the at least one first connection wiring is greater than an elongation rate of the first scan line or an elongation rate of the second scan line.

In an exemplary embodiment, each of the first pixel and the second pixel includes an organic light-emitting diode including a pixel electrode, an opposite electrode facing the pixel electrode, and an intermediate layer disposed between the pixel electrode and the opposite electrode. The intermediate layer includes an organic emission layer. Each of the first pixel and the second pixel further includes an encapsulation layer covering the organic light-emitting diode. The encapsulation layer includes a first inorganic encapsulation layer, a second inorganic encapsulation layer, and an organic encapsulation layer disposed between the first inorganic encapsulation layer and the second inorganic encapsulation layer.

In an exemplary embodiment, the display area of the display device is foldable or rollable.

As described above, the display device according to exemplary embodiments of the inventive concept includes an inorganic insulating layer including a groove disposed in a region between a plurality of pixels, and an organic material layer filling the groove, resulting in an improved flexible display device having increased strength to protect against an external impact.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EXEMPLARY EMBODIMENTS

Figure 1:
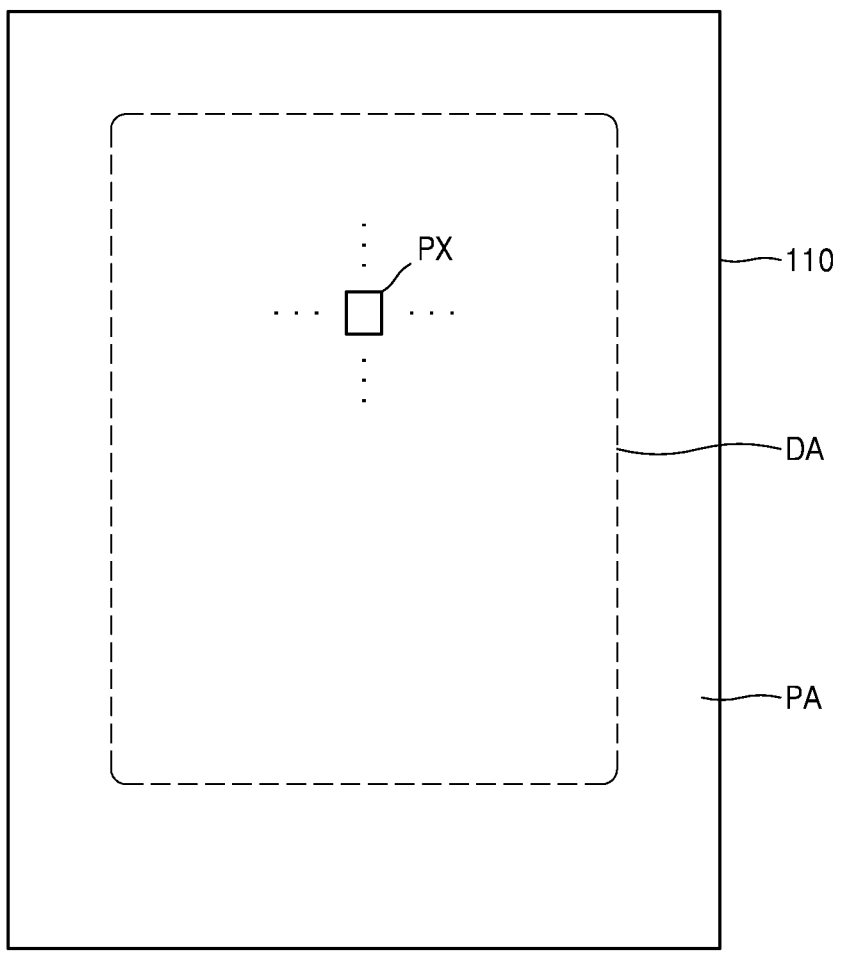
FIG. 1 is a plan view of a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

FIG. 1 is a plan view of a display device according to an exemplary embodiment of the inventive concept.

Pixels PX, which may include various display elements such as, for example, an organic light-emitting diode (OLED), may be arranged in a display area DA of a substrate 110. Various wirings transferring an electric signal to be applied to the display area DA may be arranged in a peripheral area PA of the substrate 110. An image is displayed in the display area DA. Hereinafter, for convenience of description, a display device including an OLED as a display element is described. However, the inventive concept is not limited thereto. For example, exemplary embodiments of the inventive concept are applicable to various types of display devices such as a liquid crystal display device, an electrophoretic display device, and an inorganic EL display device.

Figure 2:
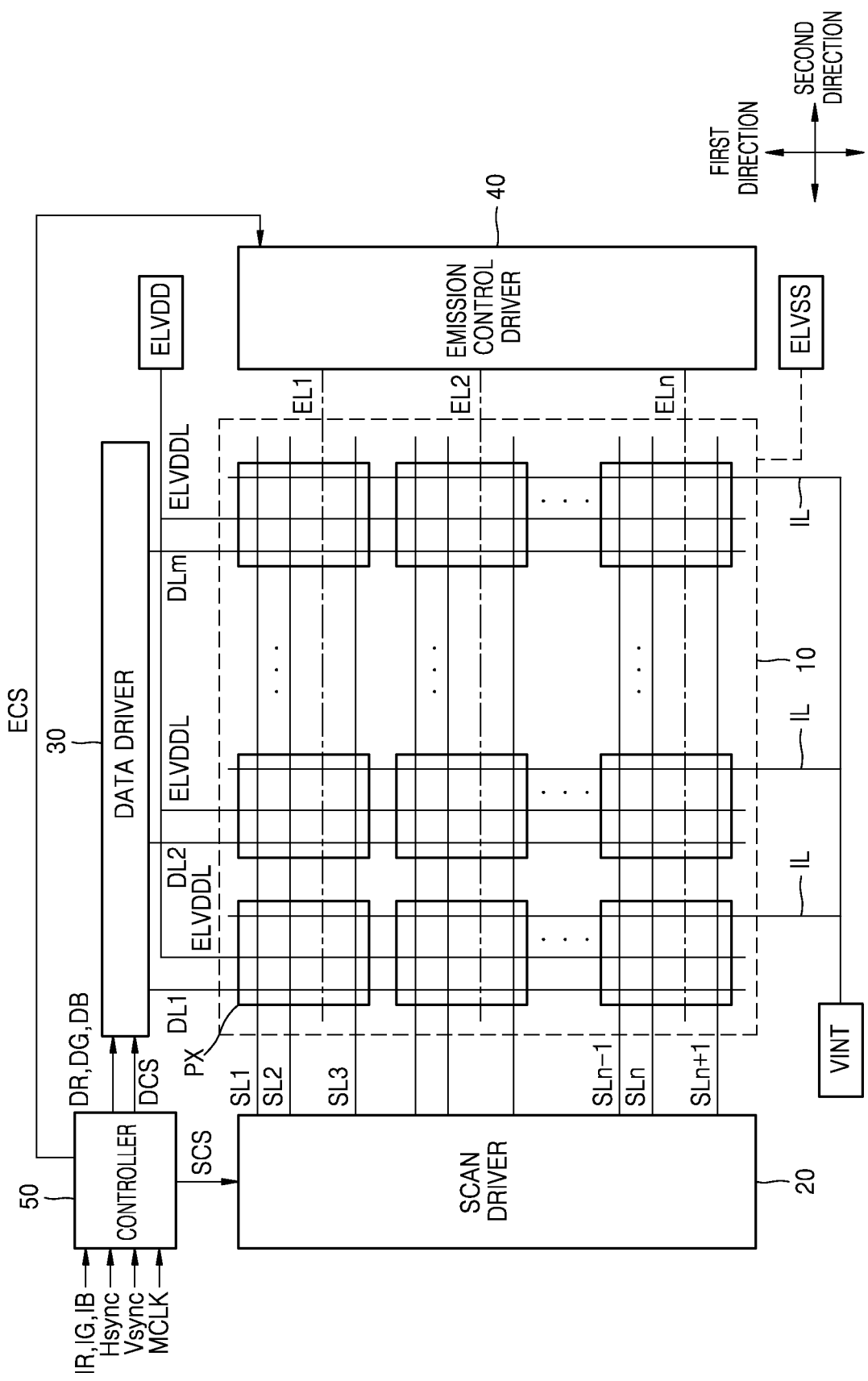
FIG. 2 is a block diagram of an organic light-emitting display device according to an exemplary embodiment of the inventive concept.

FIG. 2 is a block diagram of an organic light-emitting display device according to an exemplary embodiment of the inventive concept.

The organic light-emitting display device according to the exemplary embodiment described with reference to FIG. 2 includes a display unit 10 including a plurality of pixels PX, a scan driver 20, a data driver 30, an emission control driver 40, and a controller 50.

The display unit 10 includes a plurality of pixels PX arranged in the display area DA at intersections of a plurality of scan lines SL1 to SLn+1, a plurality of data lines DL1 to DLm, and a plurality of emission control lines EL1 to ELn. The pixels PX are arranged in a matrix. The plurality of scan lines SL1 to SLn+1 and the plurality of emission control lines EL1 to ELn extend in a second direction, and the plurality of data lines DL1 to DLm and driving voltage lines ELVDDL extend in a first direction. The first direction may also be referred to herein as a column direction, and the second direction may also be referred to herein as a row direction. In one pixel line, an n value of the plurality of scan lines SL1 to SLn+1 may be different from an n value of the plurality of emission control lines EL1 to ELn.

Each pixel PX is connected to three scan lines from among the plurality of scan lines SL1 to SLn+1 connected to the display unit 10. The scan driver 20 generates three scan signals and transfers the scan signals to each pixel PX through the plurality of scan lines SL1 to SLn+1. For example, the scan driver 20 sequentially supplies scan signals to the scan lines SL2 to SLn, the previous scan lines SL1 to SLn−1, or the next scan lines SL3 to SLn+1.

An initialization voltage line IL may receive an initialization voltage from an external power source VINT and supply the initialization voltage to each pixel PX.

Each pixel PX is connected to one of the plurality of data lines DL1 to DLm connected to the display unit 10, and is connected to one of the plurality of emission control lines EL1 to ELn connected to the display unit 10.

The data driver 30 transfers a data signal to each pixel PX through the plurality of data lines DL1 to DLm. The data signal is supplied to a pixel PX selected by a scan signal when the scan signal is supplied to the scan lines SL1 to SLn.

The emission control driver 40 generates an emission control signal and transfers the emission control signal to each pixel PX through the plurality of emission control lines EL1 to ELn. The emission control signal controls an emission time of the pixel PX. In exemplary embodiments, the emission control driver 40 may be omitted depending on an inner structure of the pixel PX.

The controller 50 converts a plurality of image signals IR, IG, and IB received from outside of the display device to a plurality of image data signals DR, DG, and DB, and transfers the plurality of image data signals DR, DG, and DB to the data driver 30. The controller 50 may further receive a vertical synchronization signal Vsync, a horizontal synchronization signal Hsync, and a clock signal MCLK. The controller 50 generates control signals for controlling the scan driver 20, the data driver 30, and the emission control driver 40, and respectively transfers the generated signals to the appropriate drivers. For example, the controller 50 generates a scan driving control signal SCS that controls the scan driver 20, a data driving control signal DCS that controls the data driver 30, and an emission driving control signal ECS that controls the emission control driver 40, and respectively transfers the generated signals to the appropriate drivers.

Each of the pixels PX receives an external driving power voltage ELVDD and a common power voltage ELVSS. The driving power voltage ELVDD may be a preset high level voltage, and the common power voltage ELVSS may be a voltage lower than the driving power voltage ELVDD or a ground voltage. The driving power voltage ELVDD is supplied to each pixel PX through a driving voltage line ELVDDL.

Each of the pixels PX emits light of a preset brightness by using a driving current supplied to a light-emitting element in response to a data signal transferred through the data lines DL1 to DLm.

Figure 3:
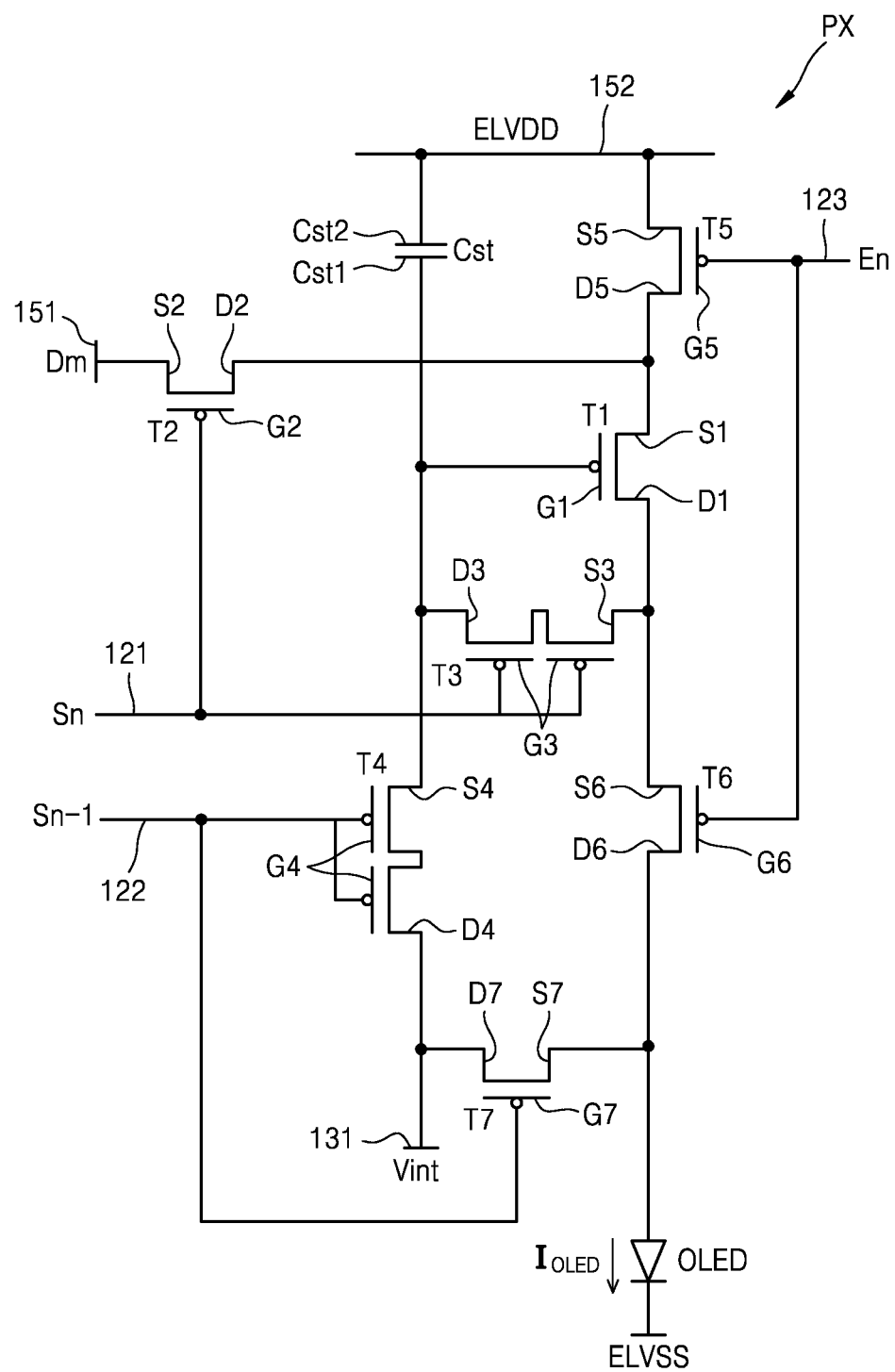
FIG. 3 is an equivalent circuit diagram of one pixel of the display device of FIG. 1 according to an exemplary embodiment of the inventive concept.

FIG. 3 is an equivalent circuit diagram of one pixel of the display device of FIG. 1 according to an exemplary embodiment of the inventive concept.

Referring to FIG. 3, the pixel PX includes signal lines 121, 122, 123, and 151, a plurality of thin film transistors (TFTs) T1, T2, T3, T4, T5, T6, and T7, and a storage capacitor Cst connected to the signal lines, an initialization voltage line 131, a driving voltage line 152, and an organic light-emitting diode (OLED). The storage capacitor Cst includes a first electrode Cst1 and a second electrode Cst2.

Although FIG. 3 illustrates an exemplary embodiment in which every pixel PX includes the signal lines 121, 122, 123, and 151, the initialization voltage line 131, and the driving voltage line 152, the inventive concept is not limited thereto. For example, in an exemplary embodiment, at least one of the signal lines 121, 122, 123, and 151, and/or the initialization voltage line 131 may be shared by the adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include the scan line 121 that transfers a scan signal Sn, the previous scan line 122 that transfers a previous scan signal Sn-1 to the first initialization TFT T4 and the second initialization TFT T7, the emission control line 123 that transfers an emission control signal En to the operation control TFT T5 and the emission control TFT T6, and the data line 151 that crosses the scan line 121 and transfers a data signal Dm. The driving voltage line 152 transfers the driving voltage ELVDD to the driving TFT T1, and the initialization voltage line 131 transfers the initialization voltage Vint that initializes the driving TFT T1 and a pixel electrode of the OLED.

A driving gate electrode G1 of the driving TFT T1 is connected to a first electrode Cst1 of the storage capacitor Cst, a driving source electrode S1 of the driving TFT T1 is connected to the driving voltage line 152 through the operation control TFT T5, and a driving drain electrode D1 of the driving TFT T1 is electrically connected to the pixel electrode of the OLED through the emission control TFT T6. The driving TFT T1 receives a data signal Dm and supplies a driving current $I_{OLED}$ to the OLED in response to a switching operation of the switching TFT T2.

A switching gate electrode G2 of the switching TFT T2 is connected to the scan line 121, a switching source electrode S2 of the switching TFT T2 is connected to the data line 151, and a switching drain electrode D2 of the switching TFT T2 is connected to the driving source electrode S1 of the driving TFT T1 and to the lower driving voltage line 152 through the operation control TFT T5. The switching TFT T2 is turned on in response to a scan signal Sn transferred through the scan line 121, and performs a switching operation of transferring a data signal Dm transferred through the data line 151 to the driving source electrode S1 of the driving TFT T1.

A compensation gate electrode G3 of the compensation TFT T3 is connected to the scan line 121, a compensation source electrode S3 of the compensation TFT T3 is connected to the driving drain electrode D1 of the driving TFT T1 and to the pixel electrode of the OLED through the emission control TFT T6, and a compensation drain electrode D3 of the compensation TFT T3 is connected to the first electrode Cst1 of the storage capacitor Cst, a first initialization source electrode S4 of the first initialization TFT T4, and the driving gate electrode G1 of the driving TFT T1. The compensation TFT T3 is turned on in response to a scan signal Sn transferred through the scan line 121 and diode-connects the driving TFT T1 by electrically connecting the driving gate electrode G1 to the driving drain electrode D1 of the driving TFT T1.

A first initialization gate electrode G4 of the first initialization TFT T4 is connected to the previous scan line 122, a first initialization drain electrode D4 of the first initialization TFT T4 is connected to a second initialization drain electrode D7 of the second initialization TFT T7 and the initialization voltage line 131, and the first initialization source electrode S4 of the first initialization TFT T4 is connected to the first electrode Cst1 of the storage capacitor Cst, the compensation drain electrode D3 of the compensation TFT T3, and the driving gate electrode G1 of the driving TFT T1. The first initialization TFT T4 is turned on in response to a previous scan signal Sn-1 transferred through the previous scan line 122, and performs an initialization operation of initializing a voltage of the driving gate electrode G1 of the driving TFT T1 by transferring the initialization voltage Vint to the driving gate electrode of the driving TFT T1.

An operation control gate electrode G5 of the operation control TFT T5 is connected to the emission control line 123, an operation control source electrode S5 of the operation control TFT T5 is connected to the lower driving voltage line 152, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and the pixel electrode of the OLED.

The operation control TFT T5 and the emission control TFT T6 are simultaneously turned on in response to an emission control signal En transferred through the emission control line 123. As a result, the driving voltage ELVDD is transferred to the OLED, thus, causing the driving current $I_{OLED}$ to flow through the OLED.

A second initialization gate electrode G7 of the second initialization TFT T7 is connected to the previous scan line 122, the second initialization source electrode S7 of the second initialization TFT is connected to the emission control drain electrode D6 of the emission control TFT T6 and the pixel electrode of the OLED, and the second initialization drain electrode D7 of the second initialization TFT T7 is connected to the first initialization drain electrode D4 of the first initialization TFT T4 and the initialization voltage line 131. The second initialization TFT T7 is turned on in response to a previous scan signal Sn-1 transferred through the previous scan line 122 to initialize the pixel electrode of the OLED.

Although FIG. 3 illustrates an exemplary embodiment in which the first initialization TFT T4 and the second initialization TFT T7 are connected to the previous scan line 122, the inventive concept is not limited thereto. For example, in an exemplary embodiment, the first initialization TFT T4 may be connected to the previous scan line 122 and driven in response to a previous scan signal Sn-1, and the second initialization TFT T7 may be connected to a separate signal line (for example, a next scan line) and driven in response to a signal transferred through the separate signal line. Locations of the source electrodes S1 to S7 and the drain electrodes D1 to D4 as illustrated in the exemplary embodiment of FIG. 3 may change depending on the type (e.g., p-type or n-type) of transistor.

A specific operation of each pixel PX according to an exemplary embodiment of the inventive concept is described below.

During an initialization period, when a previous scan signal Sn-1 is supplied through the previous scan line 122, the first initialization TFT T4 is turned on in response to the previous scan signal Sn-1, and the driving TFT T1 is initialized by the initialization voltage Vint supplied through the initialization voltage line 131.

During a data programming period, when a scan signal Sn is supplied through the scan line 121, the switching TFT T2 and the compensation TFT T3 are turned on in response to the scan signal Sn. In this case, the driving TFT T1 is diode-connected and forward-biased by the turned-on compensation TFT T3.

Then, a compensation voltage Dm+Vth, which is reduced from a data signal Dm by a threshold voltage Vth of the driving TFT T1 (the data signal Dm is supplied through the data line 151, and Vth has a negative value), is applied to the driving gate electrode G1 of the driving TFT T1.

The driving voltage ELVDD and the compensation voltage Dm+Vth are applied to two opposite ends of the storage capacitor Cst, and a charge corresponding to a voltage difference between the two opposite ends is stored in the storage capacitor Cst.

During an emission period, the operation control TFT T5 and the emission control TFT T6 are turned on in response to an emission control signal En supplied through the emission control line 123. The driving current $I_{OLED}$ corresponding to a voltage difference between a voltage of the gate electrode G1 of the driving TFT T1 and the driving voltage ELVDD occurs, and the driving current $I_{OLED}$ is supplied to the OLED through the emission control TFT T6.

Figure 4:
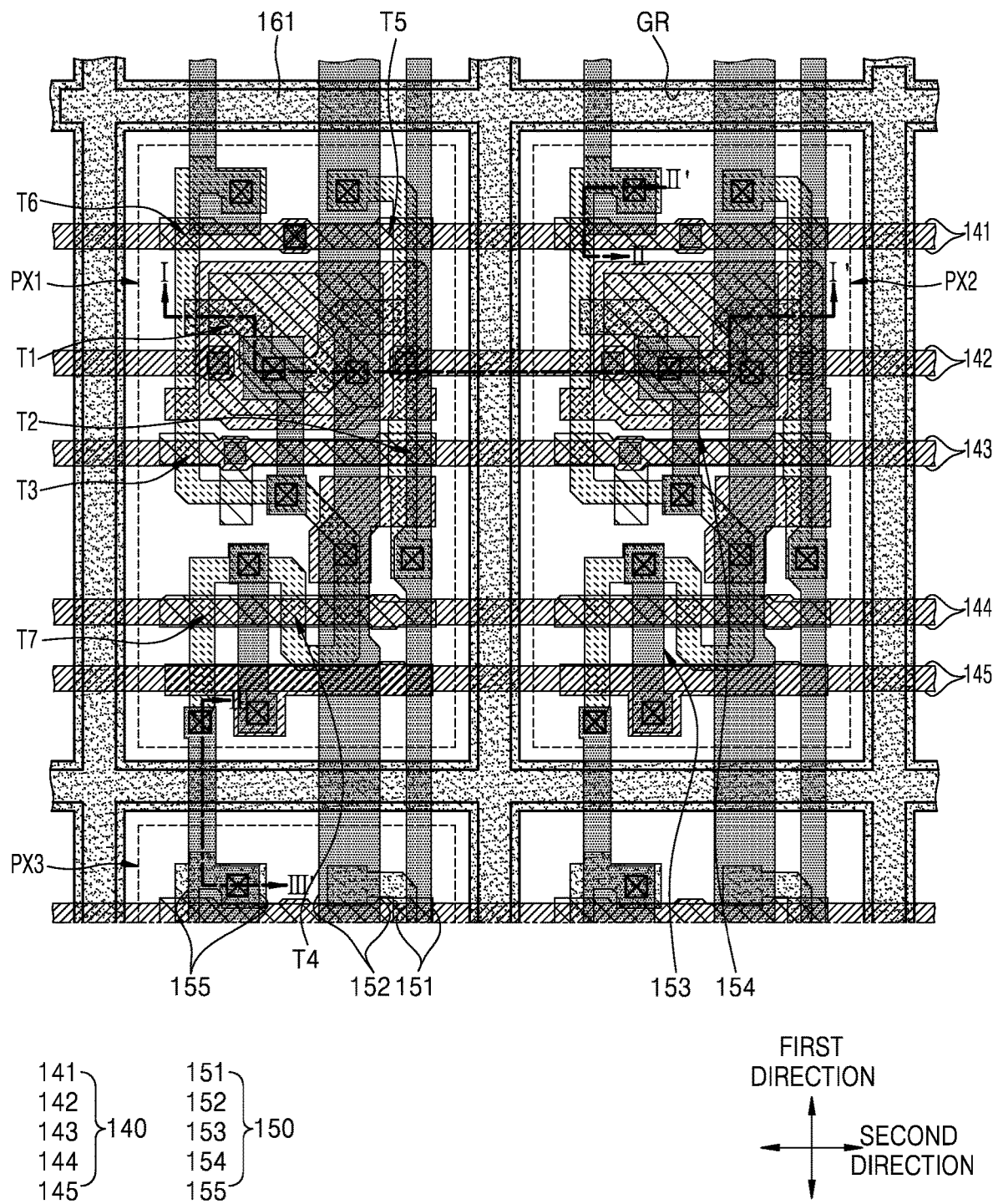
FIG. 4 is a plan view illustrating locations of a plurality of thin film transistors and a storage capacitor of adjacent pixels, according to an exemplary embodiment of the inventive concept.

FIG. 4 is a plan view illustrating locations of a plurality of thin film transistors and a storage capacitor of pixels PX1, PX2, and PX3 disposed adjacent to one another in a display device according to an exemplary embodiment of the inventive concept. FIGS. 5 to 9 are plan views illustrating, for each layer, elements such as the plurality of thin film transistors, and the storage capacitor illustrated in FIG. 4, according to an exemplary embodiment of the inventive concept. FIG. 10 is a cross-sectional view taken along lines I-I' and II-II' of FIG. 4 according to an exemplary embodiment of the inventive concept.

Referring to FIGS. 4 to 10, the display device according to an exemplary embodiment of the inventive concept includes an inorganic insulating layer including a groove GR disposed in a region between a plurality of pixels, and an organic material layer 161 that fills the groove GR. The display device may include a first connection wiring 140 disposed on the organic material layer 161. The first connection wiring 140 extends in a second direction and crosses the organic material layer 161 in the second direction. The display device may further include a second connection wiring 150 disposed on the organic material layer 161. The second connection wiring 150 extends in a first direction and crosses the organic material layer 161 in the first direction. According to exemplary embodiments, the display device may include the first connection wiring 140 and/or the second connection wiring 150. The first direction crosses the second direction.

Herein, it is to be understood that the term "between a plurality of pixels" may mean "between a plurality of pixel circuits." A pixel circuit is used to drive the display element (e.g., the OLED), and is a portion that does not include a pixel electrode of the display element.

Herein, in an exemplary embodiment, a barrier layer 101, a buffer layer 111, a first gate insulating layer 112, a second gate insulating layer 113, and a third gate insulating layer 114 disposed below the first connection wiring 140 and including an inorganic material may be collectively referred to as an inorganic insulating layer. The inorganic insulating layer includes the groove GR disposed in a region between adjacent pixels.

FIG. 10 illustrates that the inorganic insulating layer includes the groove GR. For example, in an exemplary embodiment, the barrier layer 101 is continuous over the first pixel PX1 and the second pixel PX2, which are adjacent pixels. The buffer layer 111, the first gate insulating layer 112, the second gate insulating layer 113, and the third gate insulating layer 114 may respectively include openings 111a, 112a, 113a, and 114a in a region between adjacent pixels. As shown in FIG. 10, in an exemplary embodiment, the openings 111a, 112a, 113a, and 114a form the groove GR.

For example, in an exemplary embodiment, the barrier layer 101 is continuously formed over the first pixel PX1 and the second pixel PX2 and includes no openings or breaks formed therein, and the groove GR is formed above the barrier layer 101 in the inorganic insulating layer in an area between the first pixel PX1 and the second pixel PX2 by way of formation of the openings 111a, 112a, 113a, and 114a in the buffer layer 111, the first gate insulating layer 112, the second gate insulating layer 113, and the third gate insulating layer 114, respectively.

Therefore, the inorganic insulating layer including the barrier layer 101, the buffer layer 111, the first gate insulating layer 112, the second gate insulating layer 113, and the third gate insulating layer 114 includes the groove GR in a region between the adjacent pixels. The groove GR may also be referred to as a trench formed in the inorganic insulating layer.

Herein, it is to be understood that a groove of the inorganic insulating layer may denote a structure in which the groove extends partially through some, but not all, of the layers included in the inorganic insulating layer, or a structure in which the groove entirely extends through all of the layers included in the inorganic insulating layer to expose the substrate 110, as described in further detail below.

The inorganic insulating layer may include various types of grooves different from the groove GR described above. For example, in an exemplary embodiment, a portion of an upper surface of the barrier layer 101 is removed, and a lower surface of the buffer layer 111 is not removed.

A width GRW of the groove GR of the inorganic insulating layer may be several µm. For example, the width GRW of the groove GR of the inorganic insulating layer may have a value between about 5 µm to about 10 µm.

To form the groove GR, after the third gate insulating layer 114 is formed, a separate mask process and etching process may be performed. The openings 111a, 112a, 113a, and 114a respectively formed in the buffer layer 111, the first gate insulating layer 112, the second gate insulating layer 113, and the third gate insulating layer 114 may be formed by the etching process. The etching process may be, for example, a dry etching process.

The organic material layer 161 fills the groove GR of the inorganic insulating layer. The first connection wiring 140 and the second connection wiring 150 are disposed over the organic material layer 161 in a region in which the organic material layer 161 is located. The organic material layer 161 is described in further detail below.

At least a portion of the groove GR of the inorganic insulating layer, and the organic material layer 161, may be disposed between a plurality of pixels. For example, in FIG. 4, the groove GR of the inorganic insulating layer and the organic material layer 161 surround the pixels PX1 and PX2. For example, the organic material layer 161 surrounds a circumference of the first pixel PX1 and a circumference of the second pixel PX2. For example, in an exemplary embodiment, as shown in FIG. 4, the groove GR may include a plurality of portions extending in the first and second direction that form a grid adjacent surrounding the pixels and separating the pixels from one another. However, the inventive concept is not limited thereto.

For example, in an exemplary embodiment, the groove GR of the inorganic insulating layer, and the organic material layer 161, may extend in the first direction in a region between the first pixel PX1 and the second pixel PX2 without surrounding the first and second pixels PX1 and PX2. Alternatively, the groove GR of the inorganic insulating layer, and the organic material layer 161, may extend in the second direction in a region between pixels.

According to exemplary embodiments of the inventive concept, the groove GR of the inorganic insulating layer, and the organic material layer 161, reduce an influence of an external impact on the display device. For example, referring to a comparative example in which the inorganic insulating layer does not include the groove GR, since the hardness of the inorganic insulating layer is higher than that of the organic material layer 161, a probability that a crack occurs in the inorganic insulating layer due to an external impact is high. In a case in which a crack occurs in the inorganic insulating layer that does not include the groove GR, a probability that a crack occurs in various signal lines disposed in or above the inorganic insulating layer is high. As a result, a defect, such as disconnection, may occur.

In contrast, referring to the display device according to exemplary embodiments of the inventive concept, since the inorganic insulating layer includes the groove GR in a region between the pixels, and the organic material layer 161 fills the groove GR, even when an external impact is applied to the display device, a probability that a crack propagates is low. Further, since the hardness of the organic material layer 161 is less than that of an inorganic material layer, the organic material layer 161 may absorb stress from an external impact, and thus effectively reduce the concentration of stress on the first connection wiring 140 and the second connection wiring 150 disposed over the organic material layer 161.

In an exemplary embodiment, the first connection wiring 140 and the second connection wiring 150 are disposed over the organic material layer 161 and connect pixels to one another. In an exemplary embodiment, the first connection wiring 140 and the second connection wiring 150 are disposed over the inorganic insulating layer in a region in which the organic material layer 161 is not located. The first connection wiring 140 and the second connection wiring 150 may serve as wirings that transfer an electric signal to the pixels.

Since the first connection wiring 140 and the second connection wiring 150 connect the pixels to one another, the first connection wiring 140 and the second connection wiring 150 are longer compared to the other wirings of the display device. Therefore, a probability that stress is applied to the first connection wiring 140 and the second connection wiring 150 may be high.

Therefore, a defect such as a crack or disconnection in the first connection wiring 140 and the second connection wiring 150 may be prevented by the first connection wiring 140 and the second connection wiring 150 including a material having a high elongation rate. For example, the first connection wiring 140 and the second connection wiring 150 may include aluminum (Al). The first connection wiring 140 and the second connection wiring 150 may have a multi-layered structure. In an exemplary embodiment, the first connection wiring 140 and the second connection wiring 150 may have a titanium/aluminum/titanium (Ti/Al/Ti) stacked structure. In an exemplary embodiment, an elongation rate of the first connection wiring 140 and the second connection wiring 150 may be higher than that of conductive layers disposed therebelow.

Hereinafter, a display device according to an exemplary embodiment is described with reference to FIGS. 4 to 10 in further detail.

Each of FIGS. 5 to 9 illustrates arrangements of a wiring, an electrode, a semiconductor layer, etc. arranged in the same layer. An insulating layer may be disposed between the layers illustrated in FIGS. 5 to 8. For example, the first gate insulating layer 112 (see FIG. 10) may be disposed between a layer illustrated in FIG. 5 and a layer illustrated in FIG. 6. The second gate insulating layer 113 (see FIG. 10) may be disposed between a layer illustrated in FIG. 6 and a layer illustrated in FIG. 7. The third gate insulating layer 114 (see FIG. 10) may be disposed between a layer illustrated in FIG. 7 and a layer illustrated in FIG. 8. An interlayer insulating layer 115 (see FIG. 10) may be disposed between a layer illustrated in FIG. 8 and a layer illustrated in FIG. 9. The layers illustrated in FIGS. 5 to 9 may be electrically connected to one another through a contact hole defined in at least some of the above-described insulating layers.

Figure 5:
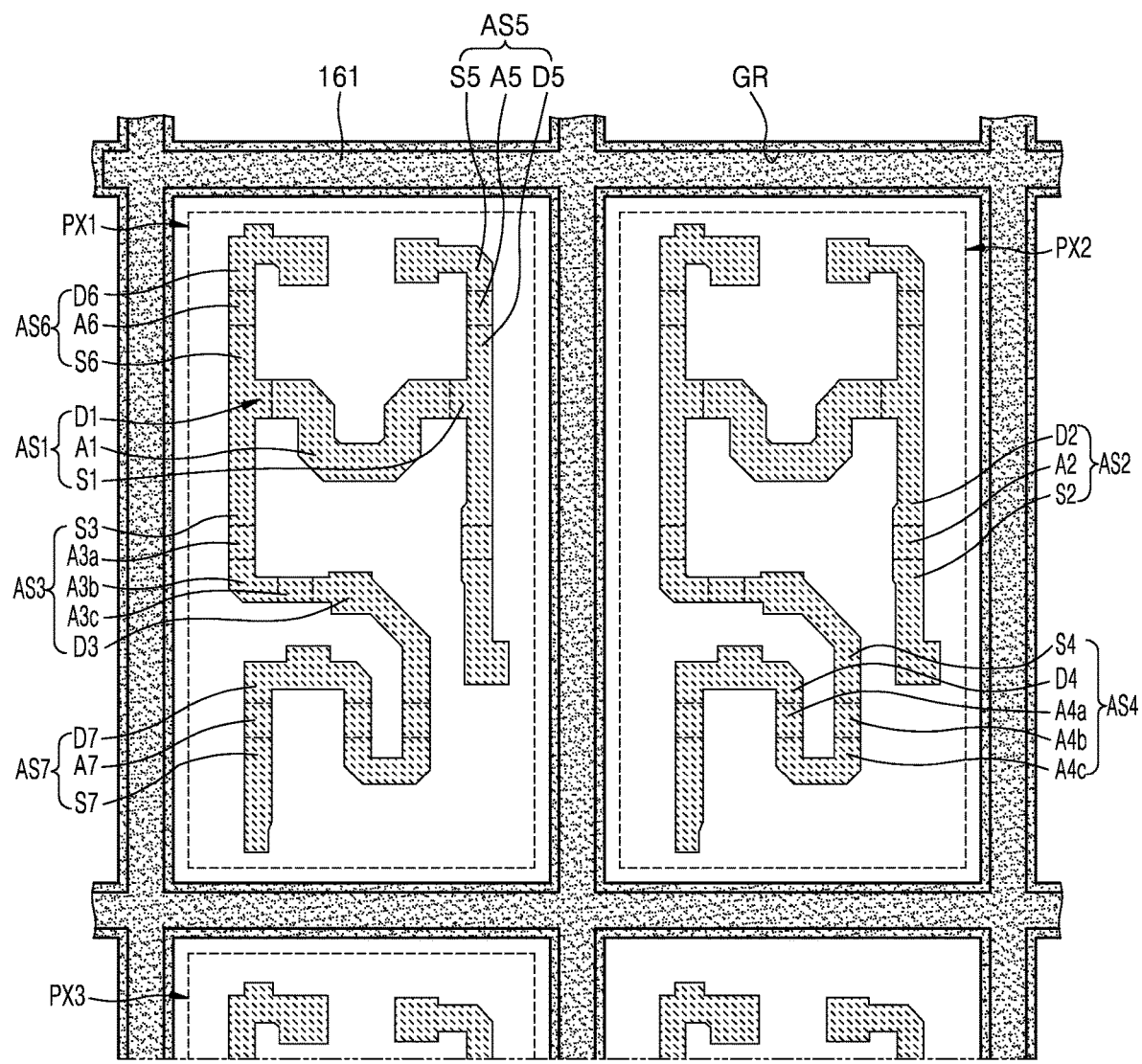
FIGS. 5 to 9 are plan views illustrating, for each layer, elements such as the plurality of thin film transistors, and the storage capacitor illustrated in FIG. 4, according to an exemplary embodiment of the inventive concept.

Referring to FIGS. 4, 5, and 10, semiconductor layers AS1 to AS7 respectively of the driving TFT T1, the switching TFT T2, the compensation TFT T3, the first initialization TFT T4, the operation control TFT T5, the emission control TFT T6, and the second initialization TFT T7 are disposed in the same layer and include the same material. For example, the semiconductor layers AS1 to AS7 may include polycrystalline silicon.

The semiconductor layers AS1 to AS7 are disposed on the buffer layer 111 (see FIG. 10) disposed over the substrate 110. The substrate 110 may include, for example, a glass material, a metal material, or a plastic material such as polyethylene terephthalate (PET), polyethylene naphthalate (PEN), and polyimide (PI). The buffer layer 111 may include, for example, an oxide layer such as SiOx, and/or a nitride layer such as SiNx.

The substrate 110 may include, for example, a glass material, a ceramic material, a metal material, or a flexible or bendable material. In a case in which the substrate 110 includes a flexible or bendable material, the substrate 110 may include polymer resins such as, for example, polyethersulphone (PES), polyacrylate (PAR), polyetherimide (PEI), PEN, PET, polyphenylene sulfide (PPS), polyarylate (PAR), PI, polycarbonate (PC), or cellulose acetate propionate (CAP). The substrate 110 may have a single-layered or multi-layered structure including the above materials. The multi-layered structure may further include an inorganic layer. In an exemplary embodiment, the substrate 110 may have a structure of an organic material/inorganic material/organic material.

The barrier layer 101 may be further disposed between the substrate 110 and the buffer layer 111. The barrier layer 101 may prevent or minimize penetration of impurities from the substrate 110, etc. into the semiconductor layers AS1 to AS7. The barrier layer 101 may include, for example, an inorganic material, an organic material, or an organic/inorganic composite material, and may include, for example, a single or multi-layered structure of an inorganic material and an organic material.

The buffer layer 111 may increase planarization of an upper surface of the substrate 110, and may include an inorganic material such as, for example, a silicon oxide, a silicon nitride, and/or a silicon oxynitride.

The driving semiconductor layer AS1 of the driving TFT T1, the switching semiconductor layer AS2 of the switching TFT T2, the compensation semiconductor layer AS3 of the compensation TFT T3, the first initialization semiconductor layer AS4 of the first initialization TFT T4, the operation control semiconductor layer AS5 of the operation control TFT T5, the emission control semiconductor layer AS6 of the emission control TFT T6, and the second initialization semiconductor layer AS7 of the second initialization TFT T7 may be connected to one another, and may be bent in various shapes.

Each of the semiconductor layers AS1 to AS7 may include a channel region, and a source region and a drain region respectively at opposite sides of the channel region. For example, the source region and the drain region may be doped with impurities, and the impurities may include N-type impurities or P-type impurities. The source region and the drain region respectively correspond to a source electrode and a drain electrode. Hereinafter, a source region and a drain region may also be respectively referred to as a source electrode or a drain electrode.

The driving semiconductor layer AS1 includes a driving channel region A1, and a driving source region S1 and a driving drain region D1 respectively at opposite sides of the driving channel region A1. The driving semiconductor layer AS1 may have a bent shape, and thus, the driving channel region A1 may be formed longer than the other channel regions A2 to A7. For example, the length of the driving channel region A1 may be greater than the length of the other channel regions A2 to A7. For example, the driving semiconductor layer AS1 may form a long channel in a narrow space by having a shape bent a plurality of number of times, forming a shape such as, for example, an Omega sign or the letter "S". Since the length of the driving channel region A1 is long, a driving range of a gate voltage applied to the driving gate electrode G1 is widened, and thus, a gray scale of light emitted from an OLED may be precisely controlled, improving display quality.

The switching semiconductor layer AS2 includes a switching channel region A2, and a switching source region S2 and a switching drain region D2 respectively at opposite sides of the switching channel region A2. The switching drain region D2 is connected to the driving source region S1.

The compensation semiconductor layer AS3 includes compensation channel regions A3a and A3c, and a compensation source region S3 and a compensation drain region D3 respectively at opposite sides of the compensation channel regions A3a and A3c. The compensation TFT T3 formed in the compensation semiconductor layer AS3 includes dual transistors and includes the two compensation channel regions A3a and A3c. A region A3b between the compensation channel regions A3a and A3c is a region doped with impurities, and locally serves as a source region of one of the dual transistors and simultaneously serves as a drain region of the other dual transistor.

The first initialization semiconductor layer AS4 includes first initialization channel regions A4a and A4c, and a first initialization source region S4 and a first initialization drain region D4 respectively at opposite sides of the first initialization channel regions A4a and A4c. The first initialization TFT T4 formed in the first initialization semiconductor layer AS4 includes dual transistors and includes the two first initialization channel regions A4a and A4c. A region A4b between the first initialization channel regions A4a and A4c is a region doped with impurities, and locally serves as a source region of one of the dual transistors and simultaneously serves as a drain region of the other dual transistor.

The operation control semiconductor layer AS5 includes an operation control channel region A5, and an operation control source region S5 and an operation control drain region D5 respectively at opposite sides of the operation control channel region A5. The operation control drain region D5 may be connected to the driving source region S1.

The emission control semiconductor layer AS6 includes an emission control channel region A6, and an emission control source region S6 and an emission control drain region D6 respectively at opposite sides of the emission control channel region A6. The emission control source region S6 may be connected to the driving drain region D1.

The second initialization semiconductor layer AS7 includes a second initialization channel region A7, and a second initialization source region S7 and a second initialization drain region D7 respectively at opposite sides of the second initialization channel region A7.

The first gate insulating layer 112 (see FIG. 10) is disposed on the semiconductor layers AS1 to AS7. The first gate insulating layer 112 may include, for example, an inorganic material including an oxide or a nitride. For example, the first gate insulating layer 112 may include $SiO_2$, SiNx, SiON, $Al_2O_3$, $TiO_2$, $Ta_2O_5$, $HfO_2$, or $ZnO_2$.

In the exemplary embodiment described herein, the semiconductor layers AS1 to AS7 of the pixels are separated from each other. For example, the semiconductor layers AS1 to AS7 of the first pixel PX1 are spaced apart from the semiconductor layers AS1 to AS7 of the second pixel PX2.

Figure 6:
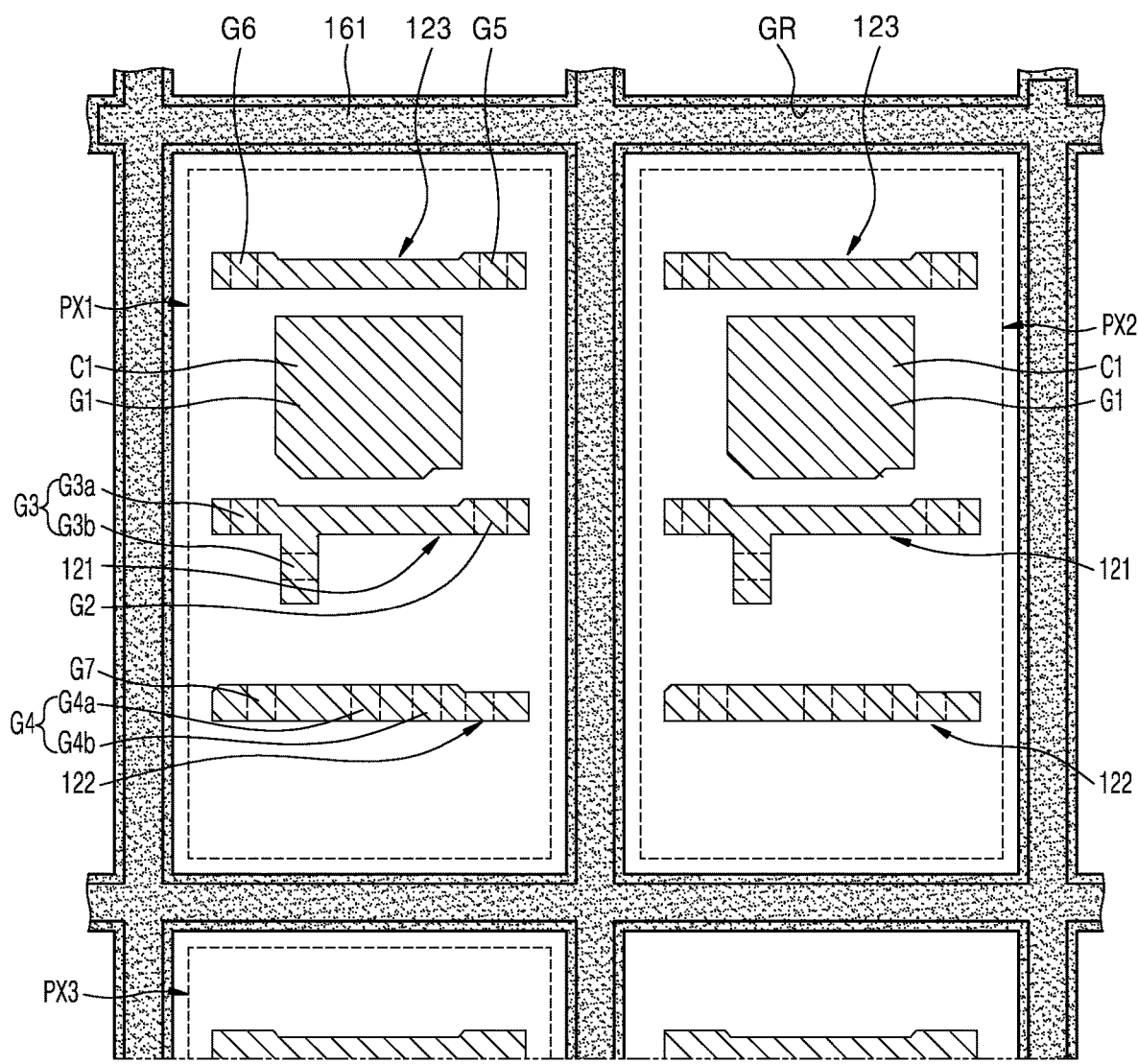

Referring to FIGS. 4, 6, and 10, the scan line 121, the previous scan line 122, the emission control line 123, and the driving gate electrode G1 are disposed over the first gate insulating layer 112. The scan line 121, the previous scan line 122, the emission control line 123, and the driving gate electrode G1 are disposed in the same layer, and include the same material. For example, the scan line 121, the previous scan line 122, the emission control line 123, and the driving gate electrode G1 may include Mo, Cu, and Ti, and may include a single layer or a multi-layer.

The driving gate electrode G1 is an island-type electrode and overlaps the driving channel region A1 of the driving semiconductor layer AS1. The driving gate electrode G1 serves as the gate electrode of the driving TFT T1 and also as the first electrode C1 of the storage capacitor Cst. For example, the driving gate electrode G1 and the first electrode C1 may be one body.

A protruding portion of the scan line 121, the previous scan line 122, and the emission control line 123 corresponds to the gate electrodes of the TFTs T2 to T7.

Regions of the scan line 121 that overlap the switching channel region A2 and the compensation channel regions A3a and A3c respectively correspond to the switching gate electrode G2 and compensation gate electrodes G3a and G3b. Regions of the previous scan line 122 that overlap the first initialization channel regions A4a and A4c and the second initialization channel region A7 respectively correspond to first initialization gate electrodes G4a and G4b, and the second initialization gate electrode G7. Regions of the emission control line 123 that overlap the operation control channel region A5 and the emission control channel region A6 respectively correspond to the operation control gate electrode G5 and the emission control gate electrode G6.

The compensation gate electrodes G3a and G3b are dual gate electrodes including the first compensation gate electrode G3a and the second compensation gate electrode G3b, and may prevent or reduce occurrence of a leakage current.

In the exemplary embodiment described herein, the scan lines 121, the previous scan lines 122, the emission control lines 123, and the driving gate electrodes G1 of the pixels are separated from one another. For example, the scan line 121, the previous scan line 122, the emission control line 123, and the driving gate electrode G1 of the first pixel PX1 are respectively spaced apart from the scan line 121, the previous scan line 122, the emission control line 123, and the driving gate electrode G1 of the second pixel PX2.

The scan line 121, the previous scan line 122, and the emission control line 123 of the first pixel PX1 may be respectively connected afterward to the scan line 121, the previous scan line 122, and the emission control line 123 of the second pixel PX2 by the first connection wiring 140 disposed in a different layer.

The second gate insulating layer 113 (see FIG. 10 is disposed over the scan line 121, the previous scan line 122, the emission control line 123, and the driving gate electrode G1. The second gate insulating layer 113 may include, for example, an inorganic material including an oxide or a nitride. For example, the second gate insulating layer 113 may include $SiO_2$, SiNx, SiON, $Al_2O_3$, $TiO_2$, $Ta_2O_5$, $HfO_2$, or $ZnO_2$.

Figure 7:
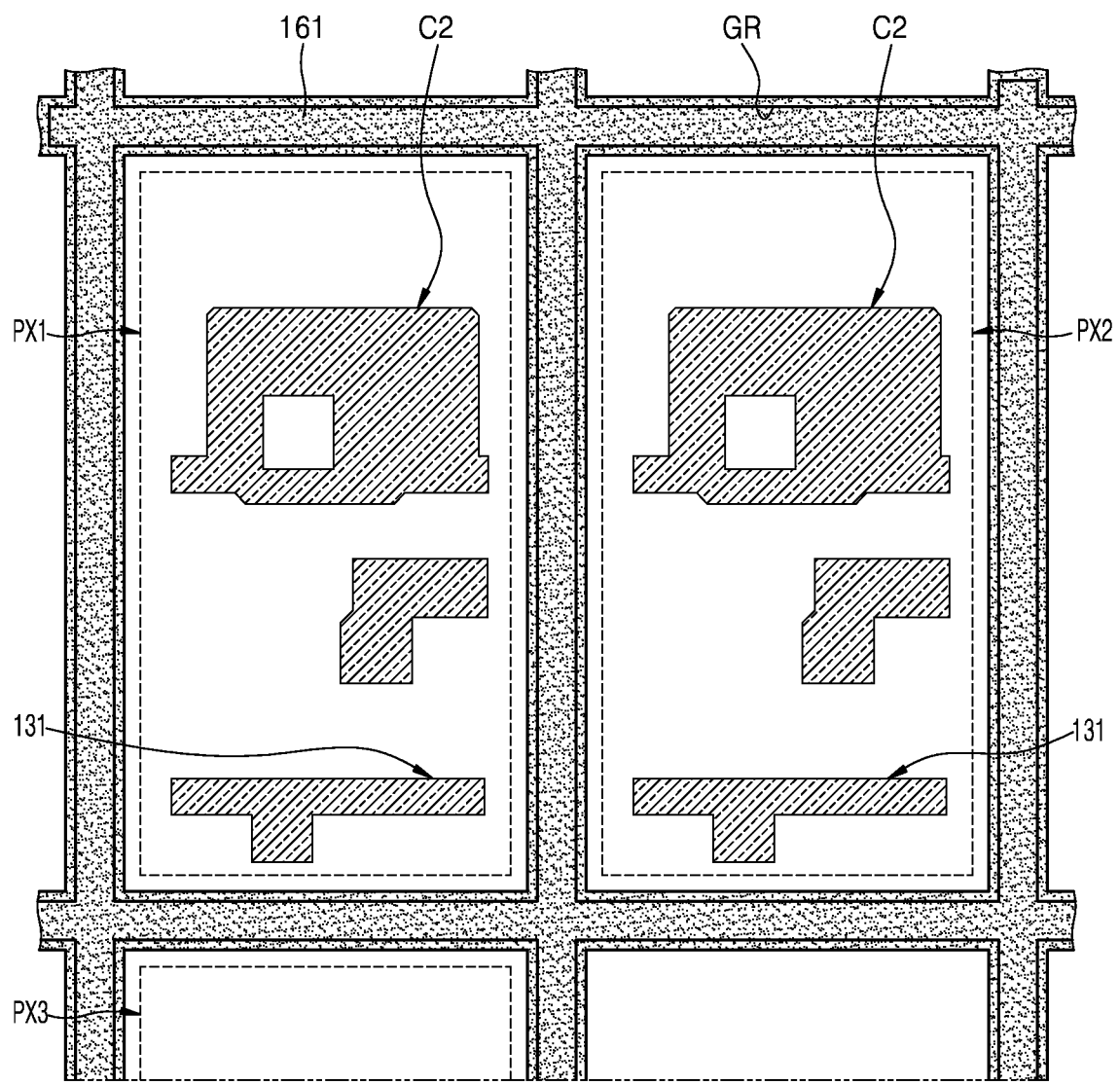

Referring to FIGS. 4, 7, and 10, the second electrode C2 of the storage capacitor Cst, and the initialization voltage line 131 are disposed on the second gate insulating layer 113.

The second electrode C2 of the storage capacitor Cst, and the initialization voltage line 131 are disposed in the same layer and include the same material. For example, the second electrode C2 of the storage capacitor Cst and the initialization voltage line 131 may include a conductive material including, for example, Mo, Cu, and Ti, and may include a single layer or a multi-layer including the above materials.

In the exemplary embodiment described herein, the second electrodes C2 of the storage capacitors Cst, and the initialization voltage lines 131 of the pixels are separated from one another. For example, the second electrode C2 of the storage capacitor Cst of the first pixel PX1 is spaced apart from the second electrode C2 of the storage capacitor Cst of the second pixel PX2, and the initialization voltage line 131 of the first pixel PX1 is spaced apart from the initialization voltage line 131 of the second pixel PX2.

The third gate insulating layer 114 (see FIG. 10) is disposed on the second electrode C2 of the storage capacitor Cst and the initialization voltage line 131. The third gate insulating layer 114 may include an inorganic material including, for example, an oxide or a nitride. For example, the third gate insulating layer 114 may include $SiO_2$, SiNx, SiON, $Al_2O_3$, $TiO_2$, $Ta_2O_5$, $HfO_2$, or $ZnO_2$.

Figure 8:
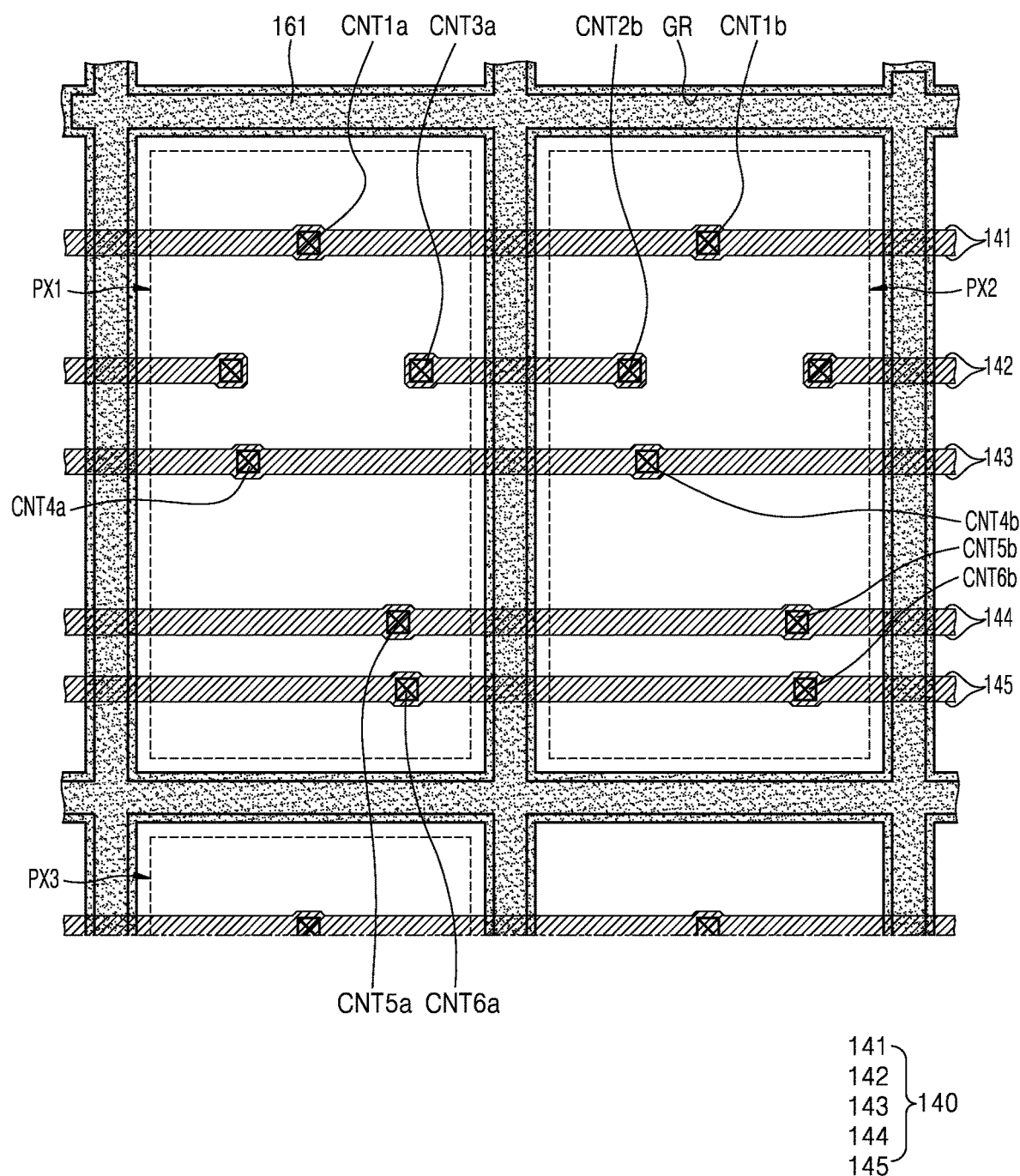

Referring to FIGS. 4, 8, and 10, the first connection wiring 140 extending in the second direction is disposed on the third gate insulating layer 114. The first connection wiring 140 extends from the first pixel PX1 to the second pixel PX2 and connects the first pixel PX1 to the second pixel PX2. The first connection wiring 140 may connect the pixels arranged in the second direction.

In the exemplary embodiment described herein, conductive layers such as the semiconductor layers AS1 to AS7, the signal lines 121, 122, and 123, the initialization voltage line 131, and the first electrode C1 and the second electrode C2 of the storage capacitor Cst disposed below the first connection wiring 140 are separated for each pixel. Therefore, propagation of stress which may occur from one pixel to another pixel may be prevented or reduced. Since the first connection wiring 140 may include a material having a high elongation rate, a defect caused by stress may be minimized.

The first connection wiring 140 may include an emission control connection line 141, a mesh connection line 142, a scan connection line 143, a previous scan connection line 144, and an initialization voltage connection line 145.

The emission control connection line 141 connects the emission control line 123 of the first pixel PX1 to the emission control line 123 of the second pixel PX2 through contact holes CNT1*a* and CNT1*b* passing through the third gate insulating layer 114 and the second gate insulating layer 113. The emission control connection line 141 may overlap the emission control line 123 of the first pixel PX1 and the emission control line 123 of the second pixel PX2, and extend in the second direction.

The mesh connection line 142 connects the second electrode C2 of the first pixel PX1 to the second electrode C2 of the second pixel PX2 through contact holes CNT3*a* and CNT2*b* passing through the third gate insulating layer 114. Since the second electrode C2 of the storage capacitor Cst is connected to the driving voltage line 152 and thus receives a driving voltage, the mesh connection line 142 may transfer the driving voltage to the pixels arranged in the second direction. Due to the mesh connection line 142, a driving voltage line having a mesh structure may be formed even without securing a space in which a separate driving voltage line extending in the second direction is arranged. Therefore, a space of the storage capacitor Cst may be further secured, and thus, a high-quality display device may be implemented.

The scan connection line 143 connects the scan line 121 of the first pixel PX1 to the scan line 121 of the second pixel PX2 through contact holes CNT4*a* and CNT4*b* passing through the third gate insulating layer 114 and the second gate insulating layer 113. The scan connection line 143 may overlap the scan line 121 of the first pixel PX1 and the scan line 121 of the second pixel PX2, and extend in the second direction.

The previous scan line 144 connects the previous scan line 122 of the first pixel PX1 to the previous scan line 122 of the second pixel PX2 through contact holes CNT5*a* and CNT5*b* passing through the third gate insulating layer 114 and the second gate insulating layer 113. The previous scan line 144 may overlap the previous scan line 122 of the first pixel PX1 and the previous scan line 122 of the second pixel PX2, and extend in the second direction.

The initialization voltage line 145 connects the initialization voltage line 131 of the first pixel PX1 to the initialization voltage line 131 of the second pixel PX2 through contact holes CNT6*a* and CNT6*b* passing through the third gate insulating layer 114. The initialization voltage line 145 may overlap the initialization voltage line 131 of the first pixel PX1 and the initialization voltage line 131 of the second pixel PX2, and extend in the second direction.

As described above, since the first connection wiring 140 passes over the organic material layer 161 disposed between the first pixel PX1 and the second pixel PX2, and connects the first pixel PX1 to the second pixel PX2, the first connection wiring 140 may supply an electric signal to the pixels.

The interlayer insulating layer 115 (see FIG. 10) may be disposed on the first connection wiring 140. The interlayer insulating layer 115 may include, for example, an inorganic material including an oxide or a nitride. For example, the interlayer insulating layer 115 may include $SiO_2$, SiNx, SiON, $Al_2O_3$, $TiO_2$, $Ta_2O_5$, $HfO_2$, or $ZnO_2$.

Figure 9:
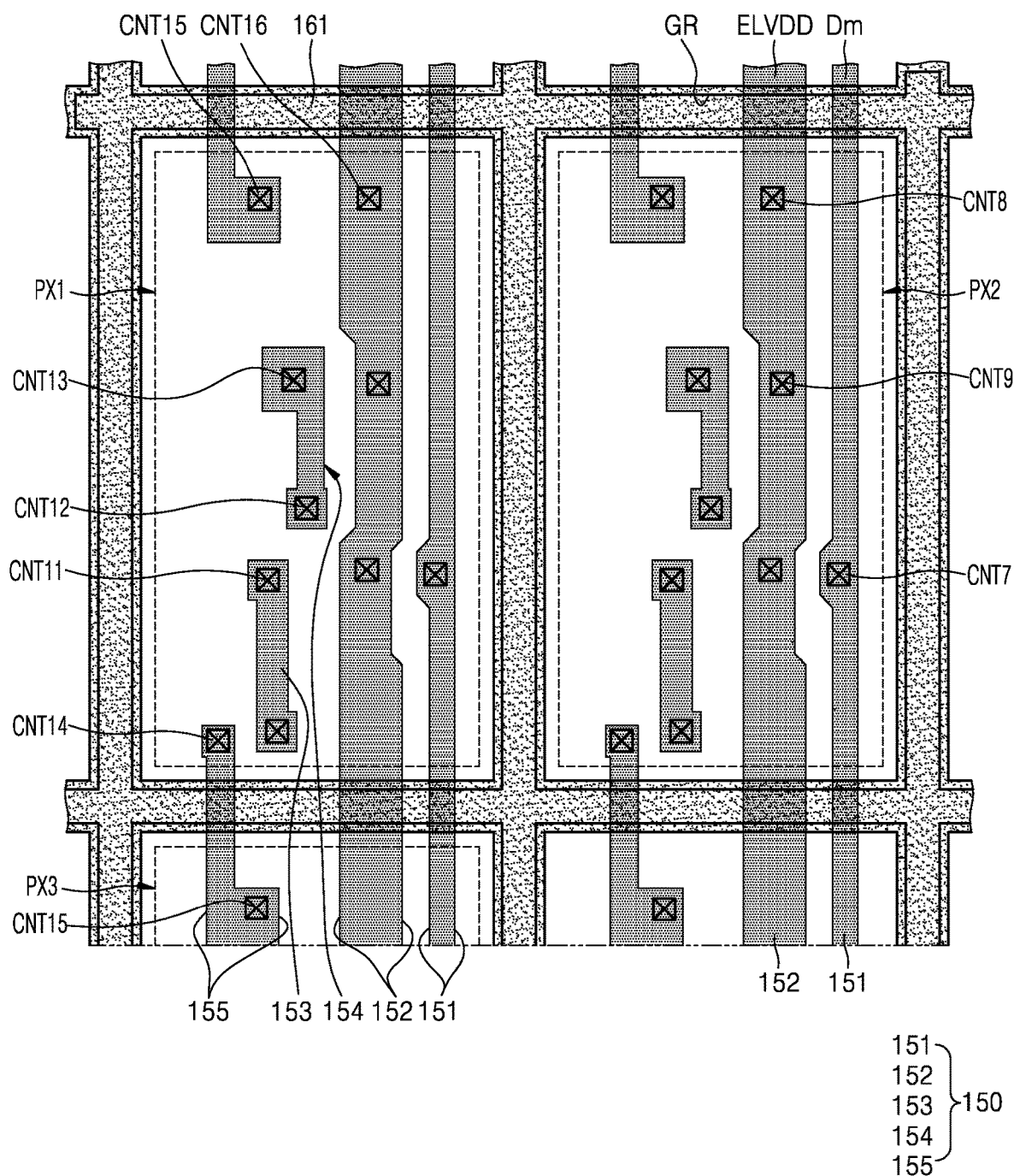
Figure 10:
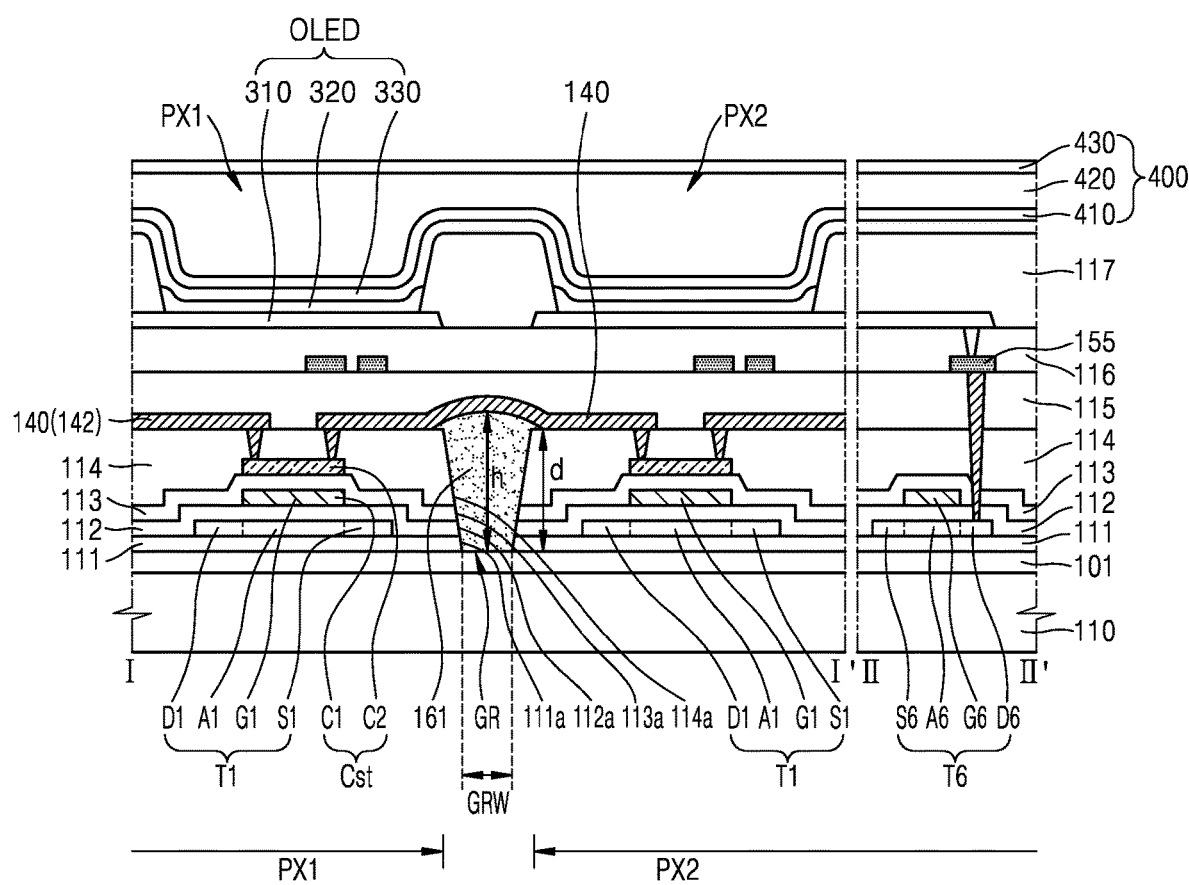
FIG. 10 is a cross-sectional view taken along lines I-I' and II-II' of FIG. 4 according to an exemplary embodiment of the inventive concept.

Referring to FIGS. 4, 9, and 10, the second connection wiring 150 extending in the first direction is disposed over the interlayer insulating layer 115. The second connection wiring 150 is insulated from the first connection wiring 140 by the interlayer insulating layer 115. The second connection wiring 150 may include the data line 151, the driving voltage line 152, a first node connection line 153, a second node connection line 154, and an intermediate connection line 155.

The data line 151, the driving voltage line 152, the first node connection line 153, the second node connection line 154, and the intermediate connection line 155 are disposed in the same layer and include the same material. For example, the data line 151, the driving voltage line 152, the first node connection line 153, the second node connection line 154, and the intermediate connection line 155 may include a conductive material having a high elongation rate.

For example, the data line 151, the driving voltage line 152, the first node connection line 153, the second node connection line 154, and the intermediate connection line 155 may include aluminum. In an exemplary embodiment, the data line 151, the driving voltage line 152, the first node connection line 153, the second node connection line 154, and the intermediate connection line 155 may have a multi-layered structure of Ti/Al/Ti.

The data line 151 is connected to the switching source region S2 of the switching TFT T2 through a contact hole CNT7 passing through the interlayer insulating layer 115, the third gate insulating layer 114, the second gate insulating layer 113, and the first gate insulating layer 112. The data line 151 may connect the pixels arranged in the first direction, for example, the first pixel PX1 and the second pixel PX2.

The driving voltage line 152 is connected to the operation control source region S5 of the operation control TFT T5 through a contact hole CNT8 passing through the interlayer insulating layer 115, the third gate insulating layer 114, the second gate insulating layer 113, and the first gate insulating layer 112.

The driving voltage line 152 is connected to the second electrode C2 of the storage capacitor Cst through a contact hole CNT9 passing through the interlayer insulating layer 115 and the third gate insulating layer 114. The driving voltage line 152 may connect the pixels arranged in the first direction, for example, the first pixel PX1 and the third pixel PX3.

The first node connection line 153 transfers the initialization voltage Vint initializing the driving TFT T1 and a pixel electrode 310 (see FIG. 10). The first node connection line 153 is connected to the first and second initialization TFTs T4 and T7 through a contact hole CNT11 passing through the interlayer insulating layer 115, the third gate insulating layer 114, the second gate insulating layer 113, and the first gate insulating layer 112, and is connected to the initialization voltage line 131 through a contact hole CNT12 passing through the interlayer insulating layer 115 and the third gate insulating layer 114.

The second node connection line 154 connects the driving gate electrode G1 to the compensation drain region D3 of the compensation TFT T3 through contact holes CNT12 and CNT13. The island type driving gate electrode G1 may be electrically connected to the compensation TFT T3 by the second node connection line 154.

The intermediate connection line 155 may be connected to the second initialization source region S7 of the second initialization TFT T7 through a contact hole CNT14 passing through the interlayer insulating layer 115, the third gate insulating layer 114, the second gate insulating layer 113, and the first gate insulating layer 112. The intermediate connection line 155 may be connected to the emission control drain region D6 of the emission control TFT T6 through a contact hole CNT15 passing through the interlayer insulating layer 115, the third gate insulating layer 114, the second gate insulating layer 113, and the first gate insulating layer 112.

The data line 151, the driving voltage line 152, and the intermediate connection line 155 may pass over the adjacent pixels in the first direction as well as the organic material layer 161 between the first pixel PX1 and the third pixel PX3, and may connect the adjacent pixels in the first direction.

A planarization layer 116 (see FIG. 10) is disposed over the data line 151, the driving voltage line 152, the first node connection line 153, the second node connection line 154, and the intermediate connection line 155. The planarization layer 116 may include, for example, an organic material such as acrylic, benzocyclobutene (BCB), PI, or hexamethyldisiloxane (HMDSO). Alternatively, the planarization layer 116 may include an inorganic material. The planarization layer 116 may generally planarize an upper portion of a protective layer covering the TFTs T1 to T7. The planarization layer 116 may include a single layer or a multi-layer.

Referring to FIG. 10, the organic material layer 161 fills at least a portion of the groove GR of the inorganic insulating layer between the first pixel PX1 and the second pixel PX2. In an exemplary embodiment, the organic material layer 161 does not completely fill the groove GR. For example, in an exemplary embodiment, the organic material layer 161 fills a first portion of the groove GR and does not fill a second portion of the groove GR.

In an exemplary embodiment, the organic material layer 161 completely fills the groove GR. As a result, an external impact may be efficiently absorbed. For example, in an exemplary embodiment, the organic material layer 161 extends to an upper surface of the inorganic insulating layer. In this case, due to a characteristic of the organic material layer 161, an upper surface of the organic material layer 161 may have a convex shape. For example, a maximum height h of the organic material layer 161 may be greater than a depth d of the groove GR, as shown in FIG. 10.

An angle formed by the upper surface of the organic material layer 161 and an upper surface of the inorganic insulating layer may be within about 45°. If a slope of a boundary region between the upper surface of the inorganic insulating layer and the upper surface of the organic material layer 161 is too steep, during a process of patterning a conductive layer to form the first connection line 140, a conductive material thereof may not be removed at the boundary region, and may remain. In this case, the remaining conductive material may cause a short circuit between the other conductive layers. Therefore, the upper surface of the organic material layer 161 may have a gentle slope with respect to the upper surface of the inorganic insulating layer.

The organic material layer 161 may include at least one of, for example, acryl, metacrylic, polyester, polyethylene, polypropylene, PET, PEN, PC, PI, polyethylenesulfonate, polyoxymethylene, polyacrylate (PAR), and HMDSO.

According to exemplary embodiments, the organic material layer 161 is disposed in the groove GR of the inorganic insulating layer in a region between the first pixel PX1 and the second pixel PX2, separating the first pixel PX1 from the second pixel PX2 below the first connection line 140. Therefore, propagation of stress or a crack from the first pixel PX1 to the second pixel PX2 may be prevented.

The OLED (see FIG. 10) may be disposed over the planarization layer 116. The OLED includes the pixel electrode 310, an opposite electrode 330, and an intermediate layer 320 arranged therebetween. The intermediate layer 320 includes an emission layer.

The pixel electrode 310 is connected to the intermediate connection line 155 through a contact hole CNT16 defined in the planarization layer 116, and is connected to the emission control drain region D6 of the emission control TFT T6 by the intermediate connection line 155.

A pixel-defining layer 117 may be disposed over the planarization layer 116. The pixel-defining layer 117 defines a pixel by including an opening corresponding to each sub-pixel, for example, an opening exposing a central portion of the pixel electrode 310. The pixel-defining layer 117 may prevent an arc or other undesired formation from occurring at an edge of the pixel electrode 310 by increasing a distance between an edge of the pixel electrode 310 and the opposite electrode 330 over the pixel electrode 310. The pixel-defining layer 117 may include, for example, an organic material such as PI or HMDSO.

The intermediate layer 320 of the OLED may include, for example, a low molecular or polymer material. In a case in which the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), etc. are stacked in a single or a composite configuration, and may include various organic materials such as, for example, copper phthalocyanine (CuPc), N,N'-Di(naphthalene-1-yl)-N,N'-diphenyl-benzidine (NPB), and tris-8-hydroxyquinoline aluminum (Alq3). These layers may be formed, for example, by vacuum evaporation.

In a case in which the intermediate layer 320 includes a polymer material, the intermediate layer 320 may generally have a structure including an HTL and an EML. In this case, the HTL may include, for example, PEDOT, and the EML may include, for example, a polymer material such as polyphenylene vinylene (PPV)-based material and a polyfluorene-based material. The intermediate layer 320 may be formed, for example, by screen printing, ink-jet printing, laser induced thermal imaging (LITI), etc.

The structure of the intermediate layer 320 is not limited to the above-described structure, and may have various structures. For example, in an exemplary embodiment, the intermediate layer 320 may include a layer having one body over a plurality of pixel electrodes 310, or may include a layer patterned to respectively correspond to the plurality of pixel electrodes 310.

The opposite electrode 330 is disposed over the display area DA. As illustrated in FIG. 10, the opposite electrode 330 may be disposed such that it covers the display area DA. That is, the opposite electrode 330 may be formed as one body over a plurality of OLEDs to correspond to the plurality of pixel electrodes 310.

Since the OLED may be damaged by external moisture or oxygen, an encapsulation layer 400 may cover and protect the OLED. The encapsulation layer 400 may cover the display area DA and extend to outside of the display area DA. The encapsulation layer 400 may include, for example, a first inorganic encapsulation layer 410, an organic encapsulation layer 420, and a second inorganic encapsulation layer 430.

The first inorganic encapsulation layer 410 may cover the opposite electrode 330, and may include, for example, ceramic, a metal oxide, a metal nitride, a metal carbide, a metal oxynitride, $In_2O_3$, $SnO_2$, ITO, a silicon oxide, a silicon nitride, and/or a silicon oxynitride. Other layers such as, for example, a capping layer, may be included between the first inorganic encapsulation layer 410 and the opposite electrode 330. Since the first inorganic encapsulation layer 410 is along a structure thereunder, an upper surface of the first inorganic encapsulation layer 410 is not planarized.

The organic encapsulation layer 420 covers the first inorganic encapsulation layer 410. Unlike the first inorganic encapsulation layer 410, an upper surface of the organic encapsulation layer 420 may be substantially flat. For example, an upper surface of a portion of the organic encapsulation layer 420 corresponding to the display area DA may be formed to be substantially flat. The organic encapsulation layer 420 may include, for example, at least one of acryl, metacrylic, polyester, polyethylene, polypropylene, PET, PEN, PC, PI, polyethylene sulfonate, polyoxymethylene (POM), PAR, and HMDSO.

The second inorganic encapsulation layer 430 may cover the organic encapsulation layer 420, and may include, for example, ceramic, a metal oxide, a metal nitride, a metal carbide, a metal oxynitride, $In_2O_3$, $SnO_2$, ITO, a silicon oxide, a silicon nitride, and/or a silicon oxynitride.

Since the encapsulation layer 400 includes the first inorganic encapsulation layer 410, the organic encapsulation layer 420, and the second encapsulation layer 430, even though a crack may occur inside the encapsulation layer 400, the encapsulation layer 400 may prevent the crack from being expanded between the first inorganic encapsulation layer 410 and the organic encapsulation layer 420, or between the organic encapsulation layer 420 and the second inorganic encapsulation layer 430 through the above-described multi-layered structure. As a result, the formation of a path through which external moisture or oxygen can penetrate into the display area DA may be prevented or minimized.

A spacer for preventing damage of a mask may be further provided on the pixel-defining layer 117, and various functional layers such as, for example, a polarization layer for reducing external light reflection, a black matrix, a color filter, and/or a touchscreen layer including a touch electrode, may be provided on the encapsulation layer 400.

Figure 11:
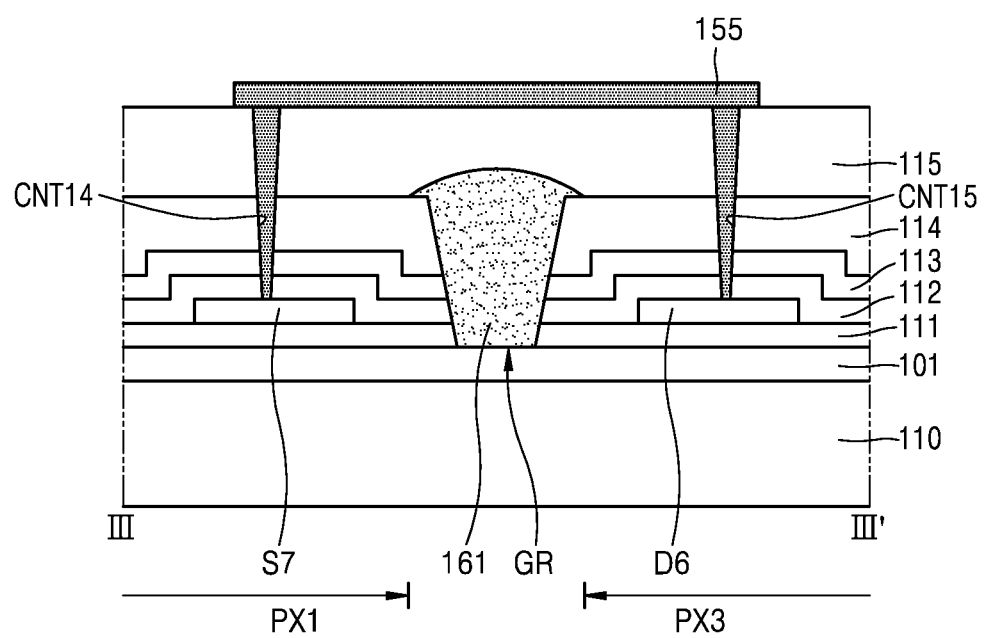
FIG. 11 is a cross-sectional view taken along line III-III' of FIG. 4 according to an exemplary embodiment of the inventive concept.

FIG. 11 is a cross-sectional view taken along line III-III' of FIG. 4 according to an exemplary embodiment of the inventive concept.

Referring to FIG. 11, one end of the intermediate connection line 155 is connected to the second initialization source region S7 of the second initialization TFT T7 of the first pixel PX1 through a contact hole CNT14 passing through the interlayer insulating layer 115, the third gate insulating layer 114, the second gate insulating layer 113, and the first gate insulating layer 112.

Another end of the intermediate connection line 155 is connected to the emission control drain region D6 of the emission control TFT T6 of the third pixel PX3 through a contact hole CNT15 passing through the interlayer insulating layer 115, the third gate insulating layer 114, the second gate insulating layer 113, and the first gate insulating layer 112.

The intermediate connection line 155 passes over the organic material layer 161 disposed between the first pixel PX1 and the third pixel PX3, connects the first pixel PX1 to the third pixel PX3, and extends in the first direction. The organic material layer 161 may be disposed in the groove GR of the inorganic insulating layer in a region between the first pixel PX1 and the third pixel PX3, and may separate the first pixel PX1 from the third pixel PX3 below the intermediate connection line 155. Therefore, propagation of stress or a crack may be prevented.

FIGS. 12 to 15 are cross-sectional views of a portion of a display device according to exemplary embodiments of the inventive concept. For example, FIGS. 12 to 15 are cross-sectional views illustrating a location corresponding to line I-I' and line II-II' in FIG. 4 according to exemplary embodiments of the inventive concept. In FIGS. 12 to 15, the same reference numerals as those of FIG. 10 denote the same elements. For convenience of explanation, a detailed description of elements previously described may be omitted herein.

Figure 12:
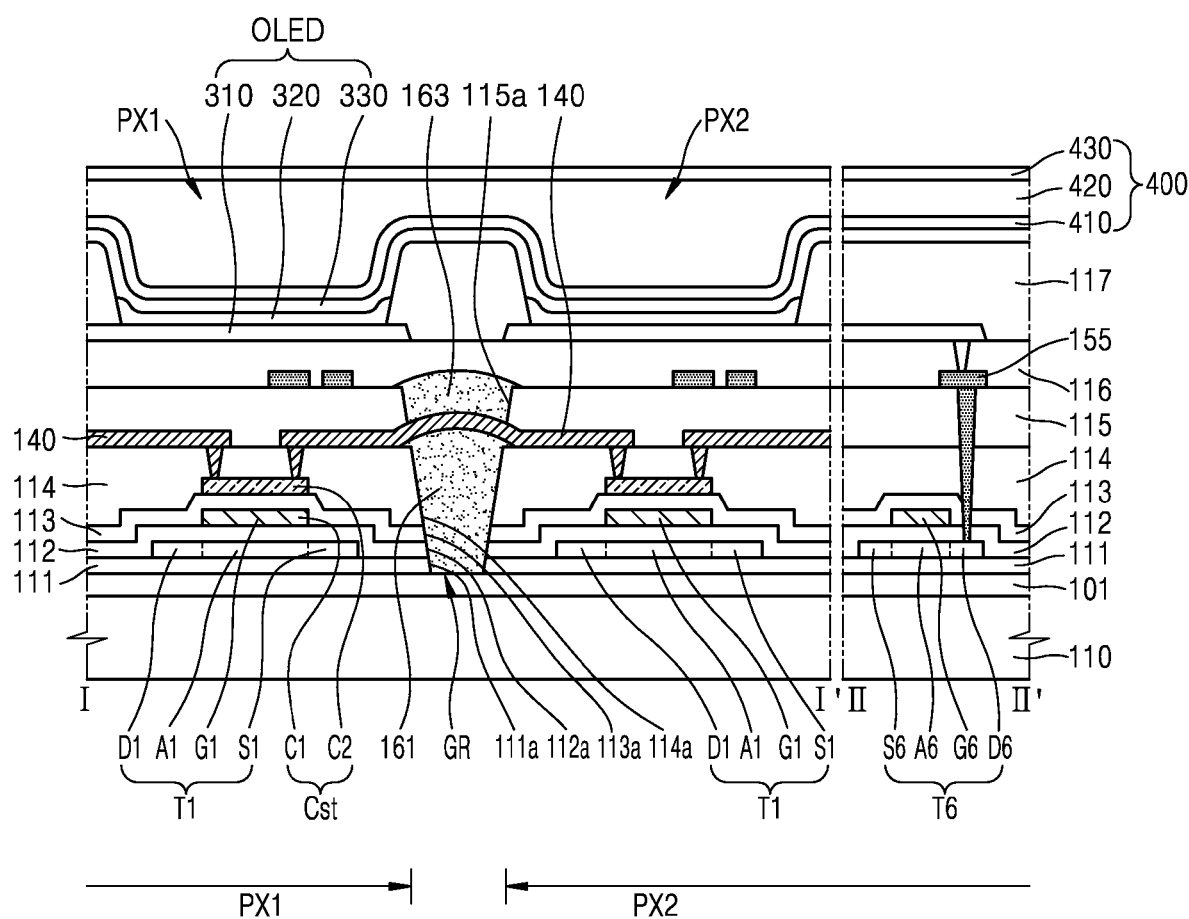
FIG. 12 is a cross-sectional view of a portion of a display device according to an exemplary embodiment of the inventive concept.

Referring to FIG. 12, the display device according to an exemplary embodiment further includes an opening 115a formed in the interlayer insulating layer 115 in a region between pixels, and an upper-organic material layer 163 filling the opening 115a. Therefore, the first connection wiring 140 may be disposed between the organic material layer 161 and the upper-organic material layer 163.

In a case in which the interlayer insulating layer 115 is an inorganic insulating layer, propagation of stress applied to the interlayer insulating layer 115 may be prevented by forming the opening 115a in a region between the pixels. Since the upper-organic material layer 163 is disposed in the opening 115a, the upper-organic material layer 163 may absorb stress applied to the display device.

Since the organic material layer 161 is disposed under the first connection wiring 140, and the upper-organic material layer 163 is disposed on the first connection wiring 140, the first connection wiring 140 may be stronger against external stress.

The upper-organic material layer 163 may include the same material as that of the organic material layer 161. The upper-organic material layer 163 may include at least one of, for example, acryl, metacrylic, polyester, polyethylene, polypropylene, PET, PEN, PC, PI, polyethylenesulfonate, polyoxymethylene, PAR, and HMDSO.

Figure 13:
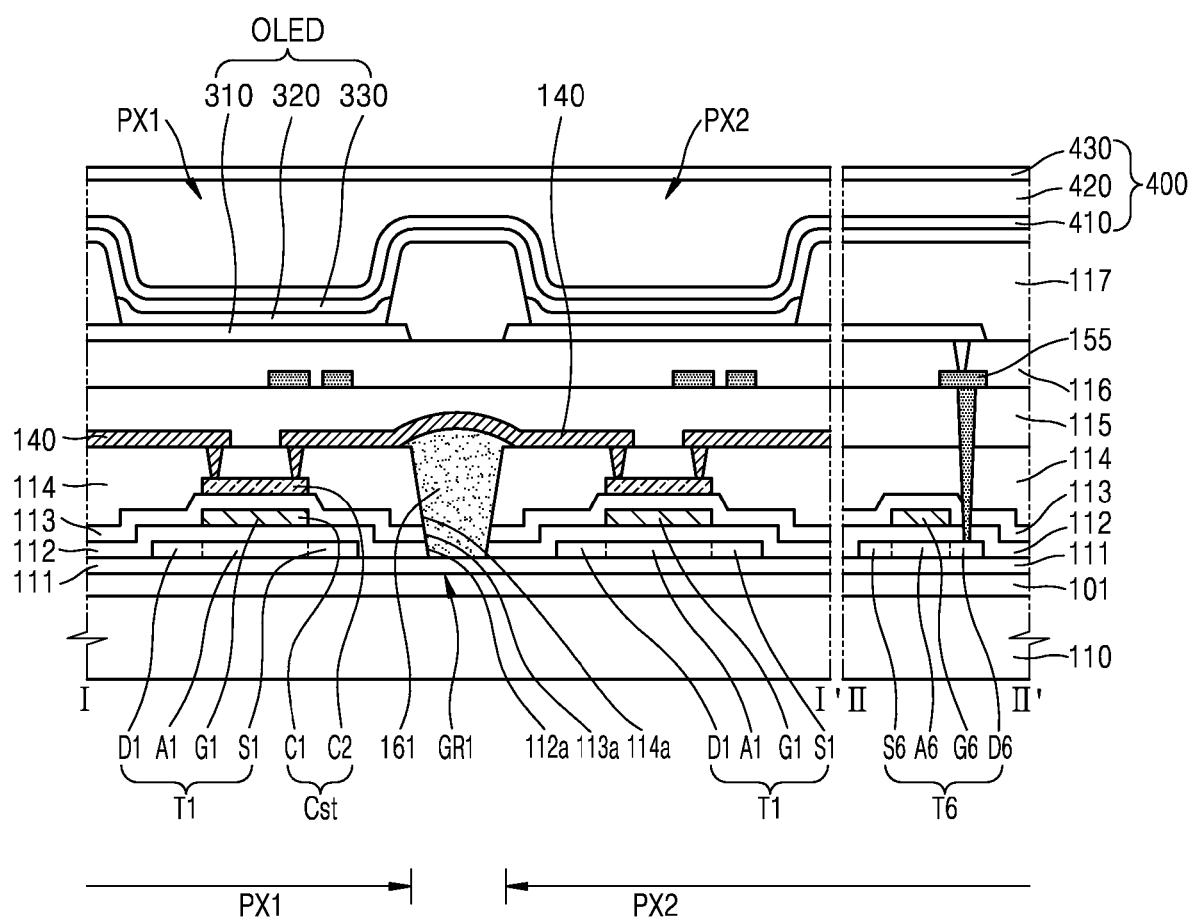
FIG. 13 is a cross-sectional view of a portion of a display device according to an exemplary embodiment of the inventive concept.

Referring to FIG. 13, in an exemplary embodiment, a shape of a groove GR1 between the first pixel PX1 and the second pixel PX2 is different from a shape of the groove GR in the exemplary embodiment of FIG. 10.

In FIG. 13, in an exemplary embodiment, the barrier layer 101 and the buffer layer 111 from among the inorganic insulating layer are continuous over pixels. For example, the barrier layer 101 and the buffer layer 111 include no openings or breaks formed therein. The first gate insulating layer 112, the second gate insulating layer 113, and the third gate insulating layer 114 respectively include openings 112a, 113a, and 114a in a region between adjacent pixels. Therefore, the inorganic insulating layer including the barrier layer 101, the buffer layer 111, the first gate insulating layer 112, the second gate insulating layer 113, and the third gate insulating layer 114 may be understood as having the groove GR1 in a region between the first pixel PX1 and the second pixel PX2.

The groove GR1 may be formed by using a separate mask process and etching process after the third gate insulating layer 114 is formed. Therefore, the shape of the groove GR1 of the inorganic insulating layers may be formed as desired.

A structure shown in FIG. 13 may be implemented, for example, by an etching process of forming the openings 112a, 113a, and 114a respectively of the first gate insulating layer 112, the second gate insulating layer 113, and the third gate insulating layer 114.

According to exemplary embodiments of the inventive concept, the groove shape of the inorganic insulating layer may vary. For example, the groove shape may extend through some or all of the layers that form the inorganic insulating layer according to exemplary embodiments. For example, in an exemplary embodiment the barrier layer 101, the buffer layer 111, and the first gate insulating layer 112 may be continuously formed over the first pixel PX1 and the second pixel PX2, and only the second gate insulating layer 113 and the third gate insulating layer 114 may respectively have the openings 113a and 114a forming the groove, or only a portion of the second gate insulating layer 113 may be removed.

The organic material layer 161 may fill the groove GR, and the first connection wiring 140 connecting adjacent pixels may be disposed on the organic material layer 161.

According to exemplary embodiments of the inventive concept, the groove formed in the inorganic insulating layer extends partially through the inorganic insulating layer. For example, in the exemplary embodiments illustrated in FIGS. 10 and 12, the groove GR extends through the third gate insulating layer 114, the second gate insulating layer 113, the first gate insulating layer 112, and the buffer layer 111, but does not extend through the barrier layer 101. In the exemplary embodiment illustrated in FIG. 13, the groove GR1 extends through the third gate insulating layer 114, the second gate insulating layer 113, and the first gate insulating layer 112, but does not extend through the buffer layer 111 and the barrier layer 101.

Figure 14:
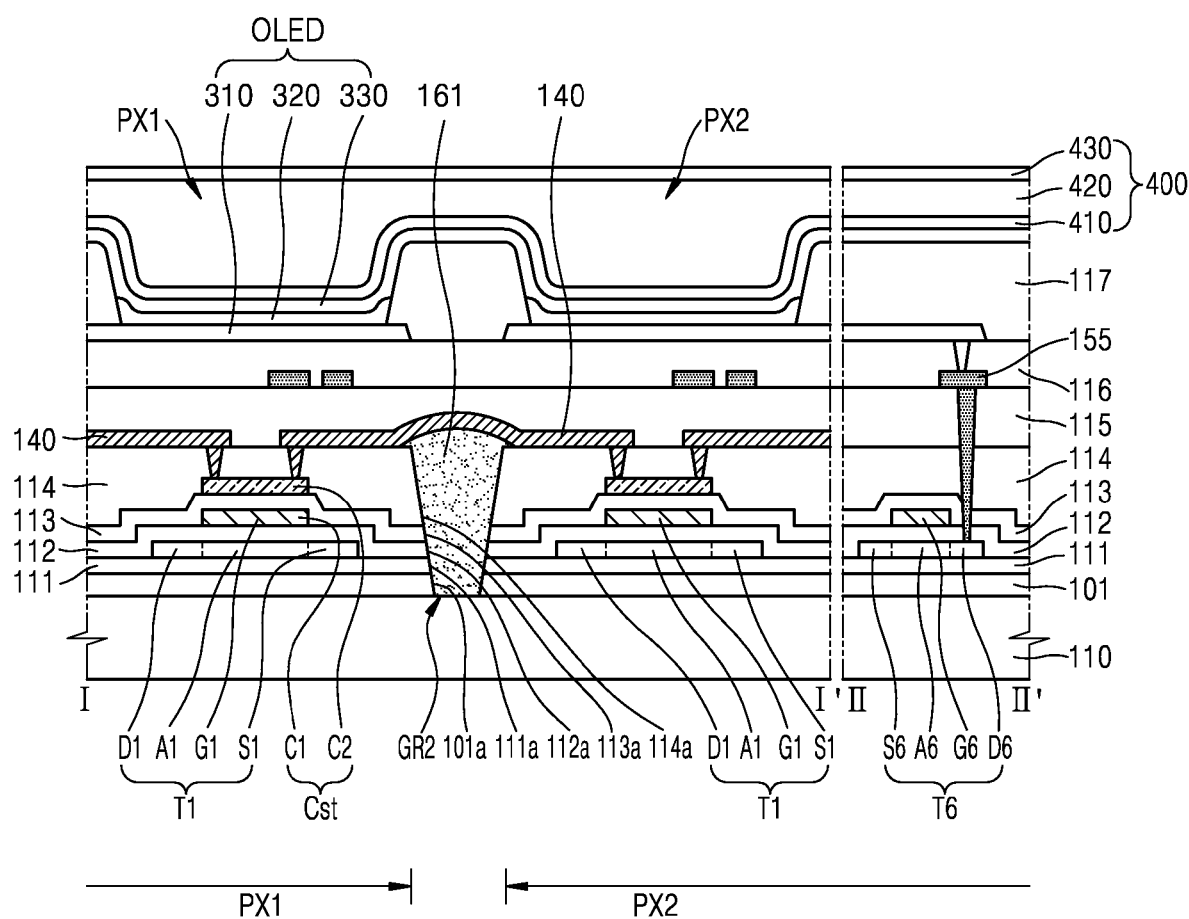
FIG. 14 is a cross-sectional view of a portion of a display device according to an exemplary embodiment of the inventive concept.

According to exemplary embodiments of the inventive concept, the groove formed in the inorganic insulating layer extends entirely through the inorganic insulating layer. For example, in the exemplary embodiment illustrated in FIG. 14, a groove GR2 extends through the third gate insulating layer 114, the second gate insulating layer 113, the first gate insulating layer 112, the buffer layer 111, and the barrier layer 101. The groove GR2 in FIG. 14 is formed via openings 101a, 111a, 112a, 113a, and 114a respectively formed in the barrier layer 101, the buffer layer 111, the first gate insulating layer 112, the second gate insulating layer 113, and the third gate insulating layer 114 in a region between the adjacent pixels.

A width of the groove GR2 may be several μm. The groove GR2 may be formed by performing a separate mask process and dry etching after the third gate insulating layer 114 is formed. Therefore, the shape of the groove GR2 may be modified as desired.

The organic material layer 161 fills the groove GR2, and the first connection wiring 140 connecting adjacent pixels may be disposed on the organic material layer 161.

According to exemplary embodiments of the inventive concept, the width of the groove (e.g., GR, GR1, GR2) may gradually decrease in a direction toward the substrate 110.

Figure 15:
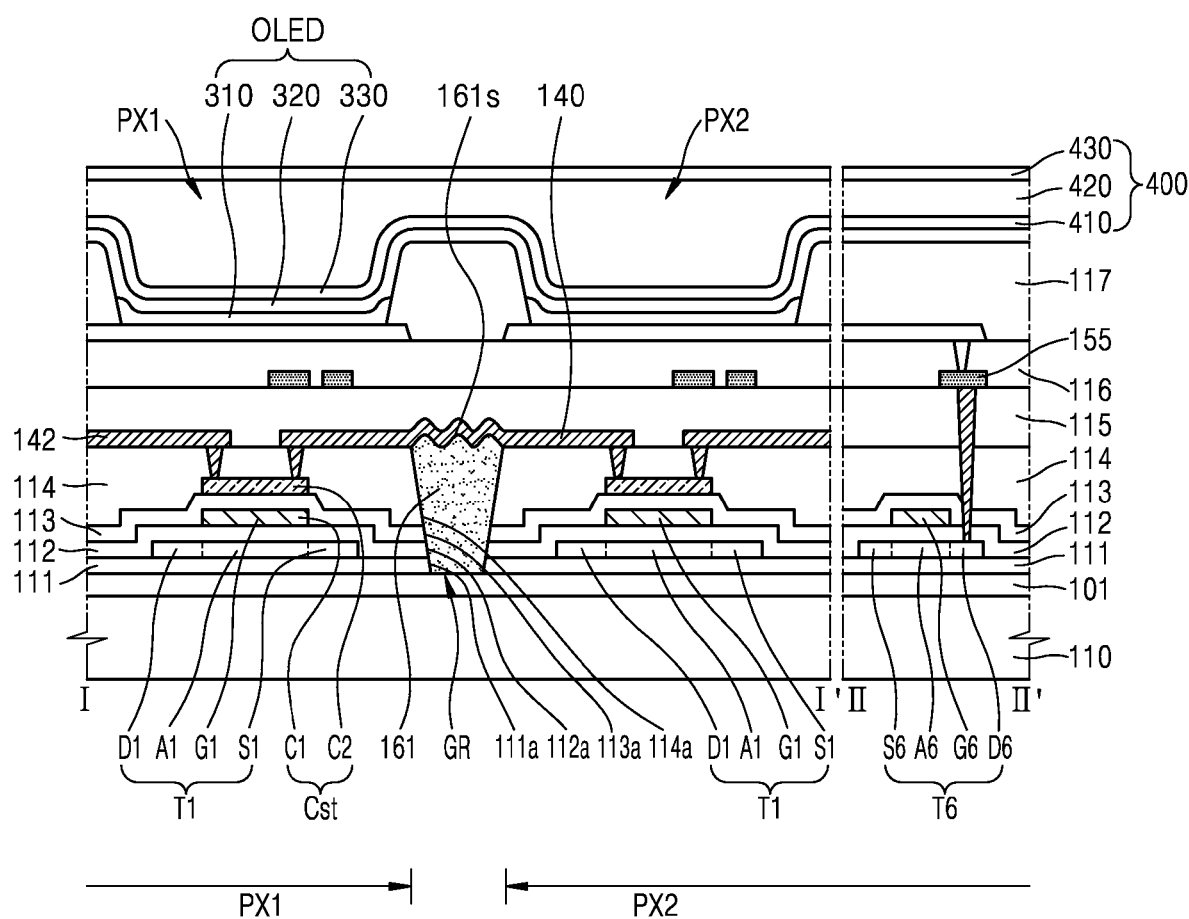
FIG. 15 is a cross-sectional view of a portion of a display device according to an exemplary embodiment of the inventive concept.

Referring to FIG. 15, in an exemplary embodiment, the organic material layer 161 has an uneven surface 161s formed in at least a portion of an upper surface thereof. According to exemplary embodiments, the uneven surface 161s may be formed in only a central portion of the organic material layer 161 or on an entire surface of the organic material layer 161.

Since the organic material layer 161 includes the uneven surface 161s, an upper surface and/or a lower surface of the first connection wiring 140 disposed on the organic material layer 161 may have a shape corresponding to the uneven surface 161s of the organic material layer 161.

Since the first connection wiring 140 extends a long distance over the pixels, an amount of stress applied to the first connection wiring 140 may be greater compared to the other wirings. An amount of tensile stress applied to the first connection wiring 140 may be reduced by forming the upper surface and/or the lower surface of the first connection wiring 140 to have a shape corresponding to the uneven surface 161s.

In an exemplary embodiment, a surface area of an upper surface of the organic material layer 161, and a surface area of upper and lower surfaces of the first connection wiring 140, are increased by forming the uneven surface 161s in at least a portion of the upper surface of the organic material layer 161. Wide surface areas of the upper surface of the organic material layer 140, and the upper and lower surfaces of the first connection wiring 140 mean that a margin by which the shape thereof may change to reduce the tensile stress is large.

Although the plan views illustrated herein are shown as including the groove GR, it is to be understood that the plan views may include the groove GR1 or the groove GR2 according to exemplary embodiments of the inventive concept.

Figure 16:
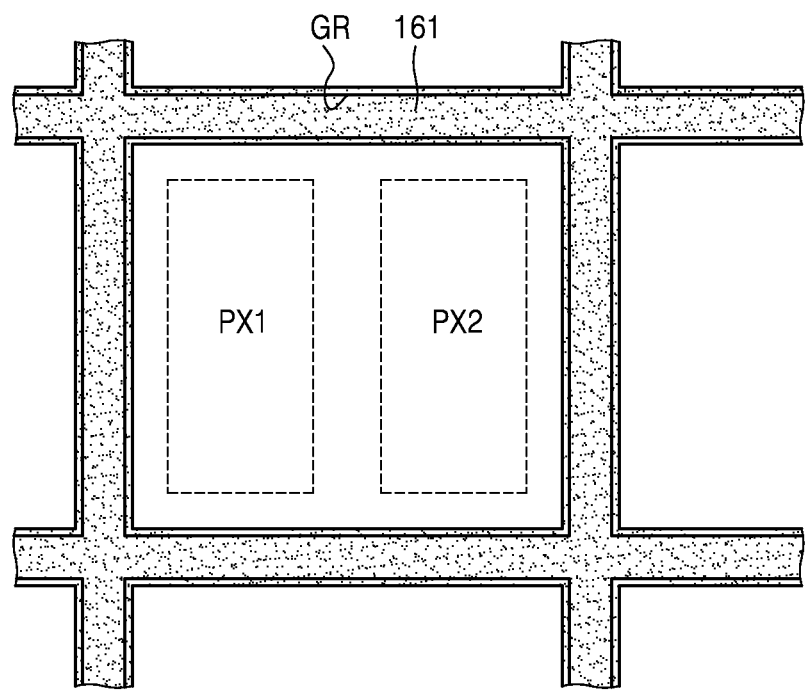
FIG. 16 is a plan view of a portion of a display device according to an exemplary embodiment of the inventive concept.
Figure 17:
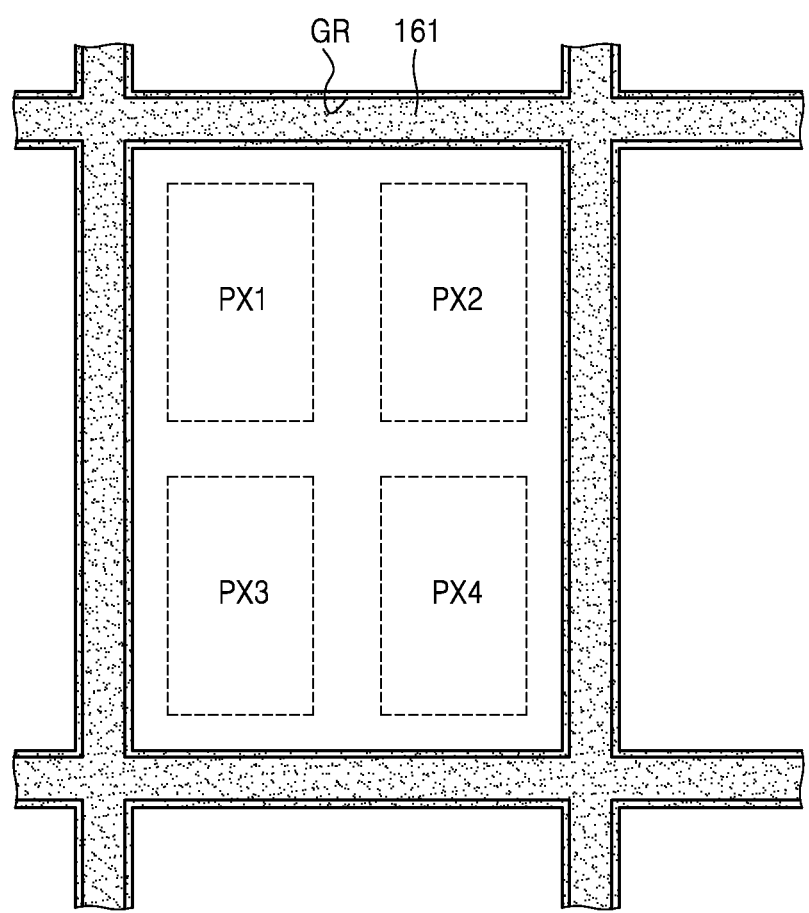
FIG. 17 is a plan view of a portion of a display device according to an exemplary embodiment of the inventive concept.

FIGS. 16 and 17 are plan views of a portion of a display device according to an exemplary embodiment of the inventive concept.

Referring to FIGS. 16 and 17, the groove GR of the inorganic insulating layer and the organic material layer 161 may group the pixels and surround the grouped pixels. For example, in FIG. 16, the groove GR of the inorganic insulating layer and the organic material layer 161 surround two pixels, for example, the first pixel PX1 and the second pixel PX2. In FIG. 17, the groove GR of the inorganic insulating layer and the organic material layer 161 surround four pixels PX1, PX2, PX3, and PX4. The number of grouped pixels may be modified variously.

The number of grouped pixels may be the same or may differ depending on a location within one display device. For example, in a region in which there is a high likelihood of a crack or stress, the groove GR of the inorganic insulating layer and the organic material layer 161 may surround one pixel, and in the remaining regions, the groove GR of the inorganic insulating layer and the organic material layer 161 may surround a plurality of pixels. Alternatively, the groove GR of the inorganic insulating layer and the organic material layer 161 may be formed in only a portion of the display area DA.

Figure 18:
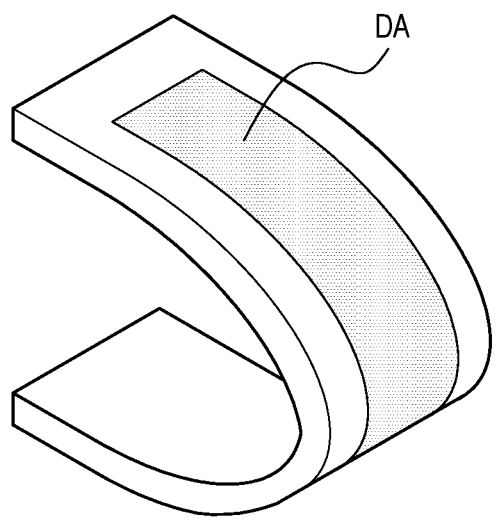
FIG. 18 is a view of a display device according to an exemplary embodiment of the inventive concept.
Figure 19:
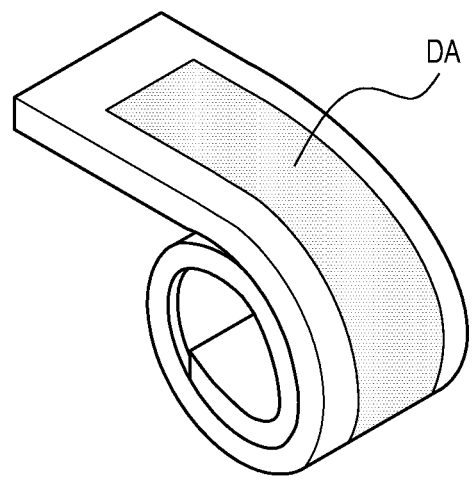
FIG. 19 is a view of a display device according to an exemplary embodiment of the inventive concept.

FIGS. 18 and 19 are views of a display device according to an exemplary embodiment of the inventive concept. FIG. 18 illustrates that a display area is folded, and FIG. 19 illustrates that a display area is rolled.

Since the display device according to an exemplary embodiment includes the groove GR of the inorganic insulating layer, and the organic material layer 161 filling the same in the display area DA, the display area DA is foldable or rollable as illustrated in FIGS. 18 and 19.

For example, even when the display area DA is folded or rolled, since the display device includes the groove GR of the inorganic insulating layer, the likelihood of the occurrence of a crack is reduced, and the organic material layer 161 filling the groove GR of the inorganic insulating layer may absorb tensile stress caused by bending.

Figure 20:
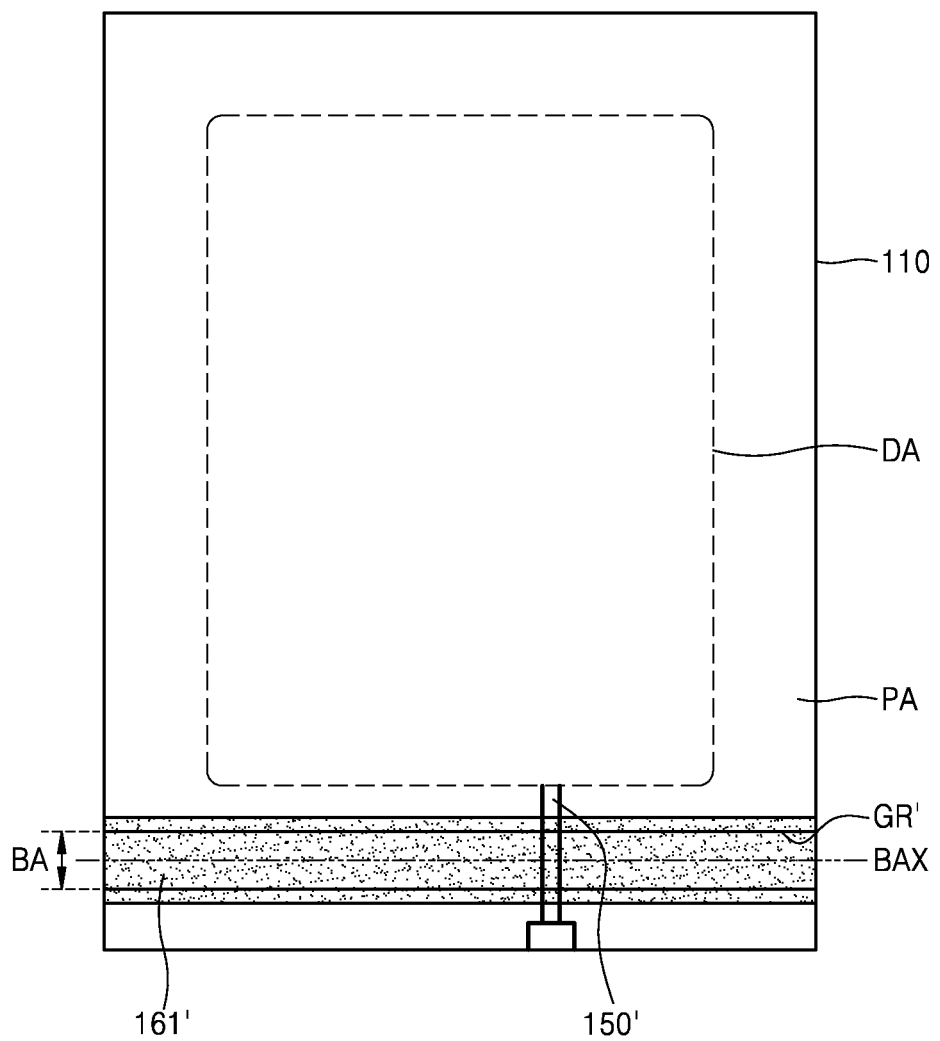
FIG. 20 is a view of a display device according to an exemplary embodiment of the inventive concept.

FIG. 20 is a view of a display device according to an exemplary embodiment of the inventive concept. Referring to FIG. 20, the display device according to an exemplary embodiment includes a bent area BA in a peripheral area PA, the bent area BA being bent around a bent axis BAX. The display device may further include a bent groove GR' and a bent organic material layer 161' filling the bent groove GR' in the bent area BA. The display device may further include a pan-out wiring 150' disposed over the bent organic material layer 161', extending from the display area DA, and crossing the bent area BA.

The bent groove GR' denotes a groove formed in a portion of the inorganic insulating layer corresponding to the bent area BA. The bent groove GR' may be simultaneously formed when the groove GR (see FIG. 10) is formed in the inorganic insulating layer in the display area DA.

The bent organic material layer 161' may fill the bent groove GR' and absorb tensile stress applied while the display device is bent. The bent organic material layer 161' may be formed simultaneously with the organic material layer 161 in the display area DA and may include the same material as that of the organic material layer 161.

The pan-out wiring 150' denotes a wiring disposed in the peripheral area PA that transfers an electric signal to the display area DA, the electric signal being provided from a driver integrated circuit (IC) arranged in the peripheral area PA or a flexible printed circuit board.

The pan-out wiring 150' may be formed simultaneously with the first connection wiring 140 or the second connection wiring 150 in the display area DA, and may include the same material as that of the first connection wiring 140 or the second connection wiring 150. For example, the pan-out wiring 150' may include a material having a high elongation rate. For example, the pan-out wiring 150' may include aluminum. The pan-out wiring 150' may have a multi-layered structure. In an exemplary embodiment, a stacked structure of Ti/Al/Ti is applicable to the pan-out wiring 150'.

Through this structure, the display device according to an exemplary embodiment may fold or roll the display area DA and/or the peripheral area PA.

Figure 21:
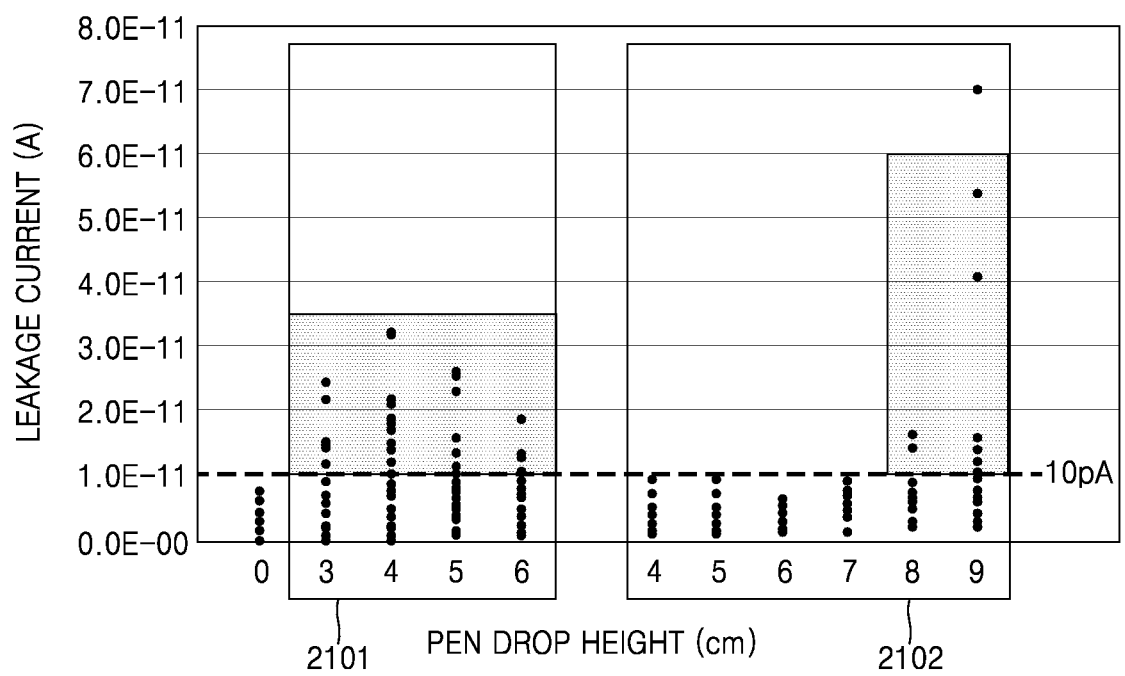
FIG. 21 is a graph illustrating data from an external impact experiment relating to an exemplary embodiment of the inventive concept and a comparative example.

FIG. 21 is a graph illustrating results of an impact resistance test of the display device according to an exemplary embodiment of the inventive concept. FIG. 21 illustrates data of measurement of a leakage current between a semiconductor layer and a gate electrode when a pen fell on the display area DA from a preset height.

The data in region 2101 is experimental data corresponding to a display device in which a groove of an inorganic insulating layer and an organic material layer are not formed in a region between pixels, according to a comparative example. The data in region 2102 is experimental data corresponding to a display device in which a groove of an inorganic insulating layer and an organic material layer are formed to surround one pixel, according to an exemplary embodiment of the inventive concept.

In the comparative example, when a pen fell from a height of about 3 cm or more, a leakage current of about 1.0 E-11 A or more occurred. In contrast, according to an exemplary embodiment of the inventive concept, even when a pen fell from a height of about 7 cm, a leakage current of about 1.0 E-11 A or more did not occur. Thus, exemplary embodiments of the present inventive concept provide improved protection against an external impact.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:
1. A display device, comprising:
a substrate comprising a display area and a peripheral area disposed outside of the display area, wherein the display area comprises a plurality of pixels;
an inorganic insulating layer disposed in the display area, wherein the inorganic insulating layer comprises a groove disposed in a region between the plurality of pixels;
an organic material layer filling the groove;
a first connection wiring disposed on the organic material layer, wherein the first connection wiring overlaps the plurality of pixels and extends in a second direction; and
a second connection wiring insulated from the first connection wiring, wherein the second connection wiring extends in a first direction that crosses the second direction,
wherein the plurality of pixels comprises a first pixel and a second pixel disposed adjacent to each other in the second direction, a scan line of the first pixel is spaced apart from a scan line of the second pixel by the groove, and the scan line of the first pixel is connected to the scan line of the second pixel by the first connection wiring.

2. The display device of claim 1, wherein the organic material layer surrounds at least some of the plurality of pixels.

3. The display device of claim 1, wherein the organic material layer surrounds each of the plurality of pixels.

4. The display device of claim 1, wherein an elongation rate of the first connection wiring is greater than an elongation rate of the scan line of the first pixel, and the elongation rate of the first connection wiring is greater than an elongation rate of the scan line of the second pixel.

5. The display device of claim 1, further comprising:
an interlayer insulating layer covering the first connection wiring, wherein the interlayer insulating layer comprises an opening exposing the organic material layer; and
an upper-organic material layer filling the opening.

6. The display device of claim 1, wherein at least a portion of an upper surface of the organic material layer comprises an uneven surface.

7. The display device of claim 1, wherein each of the plurality of pixels comprises a driving thin film transistor and a storage capacitor, wherein the driving thin film transistor overlaps the storage capacitor.

8. The display device of claim 1, further comprising:
a bendable organic material layer disposed in a bent area in the peripheral area, wherein the bent area is bent around a bending axis extending in the second direction; and
a pan-out wiring passing over the bendable organic material layer in the first direction.

9. The display device of claim 8, wherein the bendable organic material layer is simultaneously formed with the organic material layer using a same material as the organic material layer, and the pan-out wiring is simultaneously formed with the first connection wiring or the second connection wiring using a same material as the first connection wiring or the second connection wiring.

10. A display device comprising:
a substrate comprising a display area and a peripheral area disposed outside of the display area, wherein the display area comprises a plurality of pixels;
an inorganic insulating layer disposed in the display area, wherein the inorganic insulating layer comprises a groove disposed in a region between the plurality of pixels;
an organic material layer filling the groove;
a first connection wiring disposed on the organic material layer, wherein the first connection wiring overlaps the plurality of pixels and extends in a second direction; and
a second connection wiring insulated from the first connection wiring, wherein the second connection wiring extends in a first direction that crosses the second direction,
wherein the organic material layer at least partially overlaps an upper surface of the inorganic insulating layer.

11. A display device, comprising:
a substrate comprising a display area;
a first pixel;
a second pixel disposed adjacent to the first pixel in the display area in a second direction;
at least one first connection wiring connecting the first pixel to the second pixel;
a first scan line included in the first pixel and extending in the second direction;
a second scan line included in the second pixel and extending in the second direction;
a gate insulating layer covering the first scan line and the second scan line, wherein the gate insulating layer comprises a groove disposed in a region between the first pixel and the second pixel;
an organic material layer filling the groove; and
a scan connection line disposed over the gate insulating layer and the organic material layer,
wherein the scan connection line connects the first scan line to the second scan line through a contact hole, and the scan connection line is included in the at least one first connection wiring.

12. The display device of claim 11, further comprising:
a third pixel disposed in the display area, wherein the third pixel is adjacent to the first pixel in a first direction crossing the second direction; and
at least one second connection wiring connecting the first pixel to the third pixel,
wherein a first semiconductor layer included in the first pixel is spaced apart from a third semiconductor layer included in the third pixel by the organic material layer, and an intermediate connection line included in the at least one second connection wiring crosses over the organic material layer and connects the first semiconductor layer to the third semiconductor layer through a contact hole.

13. The display device of claim 12, wherein the at least one first connection wiring is insulated from the at least one second connection wiring by an interlayer insulating layer.

14. The display device of claim 12, wherein the at least one second connection wiring further comprises a driving voltage line and a data line.

15. The display device of claim 11, wherein each of the first pixel and the second pixel comprises a driving thin film transistor and a storage capacitor, the driving thin film transistor overlaps the storage capacitor, and an upper electrode of the storage capacitor of the first pixel is connected to an upper electrode of the storage capacitor of the second pixel by a mesh connection line included in the at least one first connection wiring.

16. The display device of claim 11, further comprising:
an interlayer insulating layer covering the at least one first connection wiring, wherein the interlayer insulating layer comprises an opening exposing the organic material layer; and
an upper-organic material layer filling the opening of the interlayer insulating layer.

17. The display device of claim 11, wherein an elongation rate of the at least one first connection wiring is greater than an elongation rate of the first scan line or an elongation rate of the second scan line.

18. The display device of claim 11, wherein each of the first pixel and the second pixel comprises:
an organic light-emitting diode comprising a pixel electrode, an opposite electrode facing the pixel electrode, and an intermediate layer disposed between the pixel electrode and the opposite electrode, wherein the intermediate layer comprises an organic emission layer; and
an encapsulation layer covering the organic light-emitting diode, wherein the encapsulation layer comprises a first inorganic encapsulation layer, a second inorganic encapsulation layer, and an organic encapsulation layer disposed between the first inorganic encapsulation layer and the second inorganic encapsulation layer.

19. The display device of claim 11, wherein the display area of the display device is foldable or rollable.

* * * * *